United States Patent [19]
Suenaga et al.

[11] Patent Number: 5,930,049
[45] Date of Patent: Jul. 27, 1999

[54] PROJECTION OPTICAL SYSTEM AND METHOD OF USING SUCH SYSTEM FOR MANUFACTURING DEVICES

[75] Inventors: Yutaka Suenaga; Kotaro Yamaguchi, both of Yokohama, Japan

[73] Assignee: Nikon Corporation, Tokyo, Japan

[21] Appl. No.: 08/876,176

[22] Filed: Jun. 13, 1997

[30] Foreign Application Priority Data

Oct. 1, 1996 [JP] Japan .................................. 8-261000
Apr. 25, 1997 [JP] Japan .................................. 9-109746

[51] Int. Cl.⁶ .............................. G02B 3/00; G03B 27/42
[52] U.S. Cl. ........................ 359/650; 359/649; 359/766; 355/53
[58] Field of Search .................................. 359/649, 650, 359/766; 355/67, 53; 362/268

[56] References Cited

U.S. PATENT DOCUMENTS

| | | | |
|---|---|---|---|
| 3,504,961 | 4/1970 | Hoogland et al. | 359/754 |
| 3,897,138 | 7/1975 | Kano | 359/674 |
| 3,909,115 | 9/1975 | Kano | 359/754 |
| 4,497,015 | 1/1985 | Konno et al. | 362/268 |
| 4,666,273 | 5/1987 | Shimizu et al. | 353/101 |
| 4,770,477 | 9/1988 | Shafer | 359/355 |
| 4,772,107 | 9/1988 | Freidman | 359/754 |
| 4,811,055 | 3/1989 | Hirose | 355/53 |
| 4,891,663 | 1/1990 | Hirose | 355/53 |
| 4,918,583 | 4/1990 | Kudo et al. | 366/268 |
| 5,105,075 | 4/1992 | Ohta et al. | 250/201.2 |
| 5,245,384 | 9/1993 | Mori | 355/67 |
| 5,260,832 | 11/1993 | Togino et al. | 359/679 |
| 5,335,044 | 8/1994 | Shiraishi | 355/53 |
| 5,420,417 | 5/1995 | Shiraishi | 250/205 |

FOREIGN PATENT DOCUMENTS

| | | |
|---|---|---|
| 712019 | 5/1996 | European Pat. Off. . |
| 717299 | 6/1996 | European Pat. Off. . |
| 721150 | 7/1996 | European Pat. Off. . |
| 732605 | 9/1996 | European Pat. Off. . |
| 770895 | 5/1997 | European Pat. Off. . |
| 47-35017 | 9/1972 | Japan . |
| 55-12902 | 1/1980 | Japan . |
| 63-118115 | 5/1988 | Japan . |
| 5-173065 | 7/1993 | Japan . |
| 6-313845 | 11/1994 | Japan . |
| 7-140384 | 6/1995 | Japan . |
| 7-140385 | 6/1995 | Japan . |

OTHER PUBLICATIONS

SPIE vol. 811 of Optical Microlithographic Technology . . . , pp. 22–30 (1987) Braat, J., "Quality of Microlithographic . . . ".

Primary Examiner—Evelyn A. Lester
Attorney, Agent, or Firm—Michael N. Meller

[57] ABSTRACT

A projection optical system is provided which forms an image of a first object onto a second object and includes, in order from the first object side:

a first positive lens group G1 with a subgroup G-1$p$ having at least two positives lenses;

a second negative lens group G2 with a subgroup G-2$n$ having at least three negative lenses;

a third lens group G3 with a subgroup G-3$p$ having at least three positives lenses and one negative lens;

a four negative lens group G4 with a subgroup G-4$n$ having at least three negative lenses;

a fifth positive lens group G5 with a subgroup G-5$p$ having at least five positives lenses and having a positive lens G-5$g$ arranged closer to the second object side than the subgroup G-5$p$ and having a concave surface facing the second object side. The projection optical system provides an optimal range for the focal length and the preferable range of the radius of curvature for the concave surface R5$g$ of the positive lens G-5$g$.

29 Claims, 14 Drawing Sheets

TANGENTIAL                     SAGITTAL
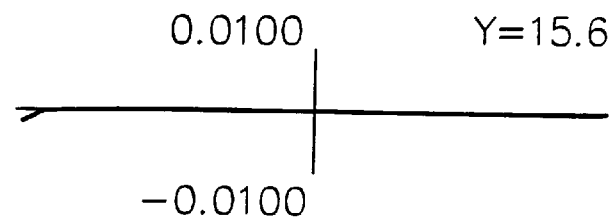 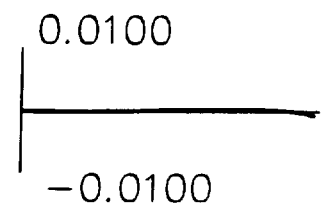
Y=15.6
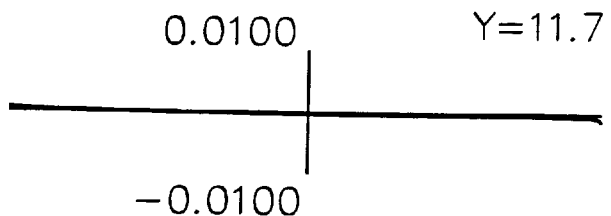 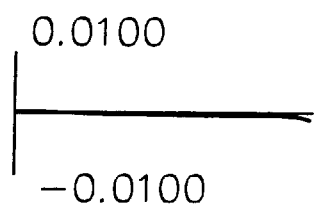
Y=11.7
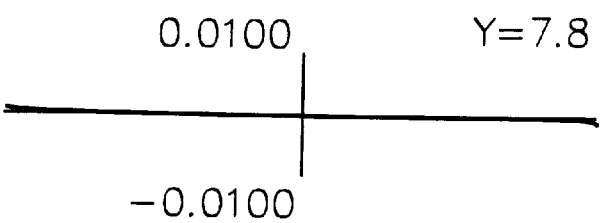 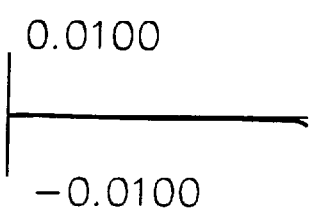
Y=7.8
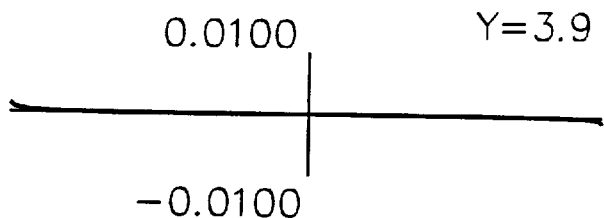 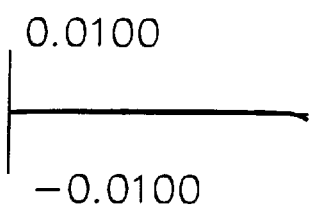
Y=3.9
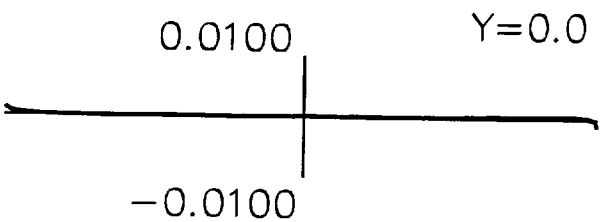 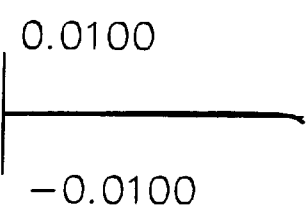
Y=0.0
FIG. 11

TANGENTIAL SAGITTAL
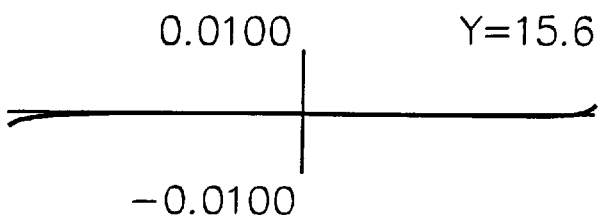 Y=15.6 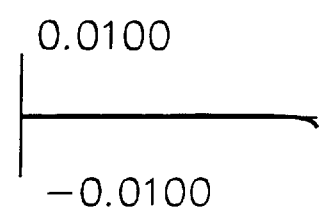
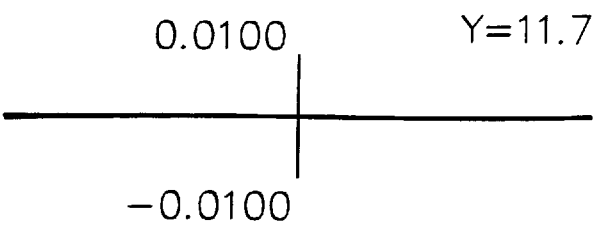 Y=11.7 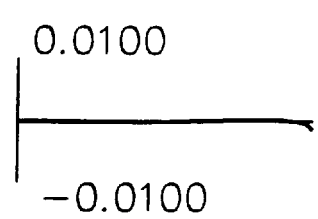
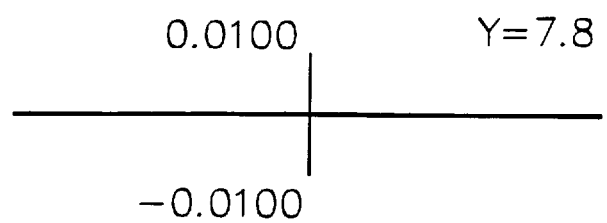 Y=7.8 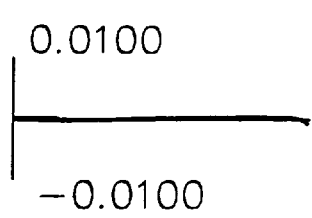
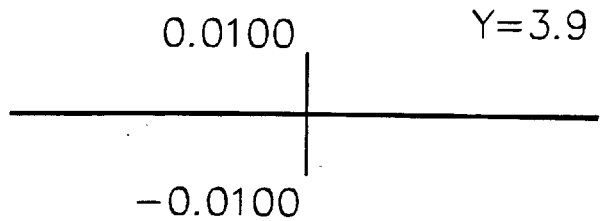 Y=3.9 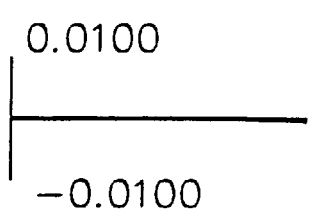
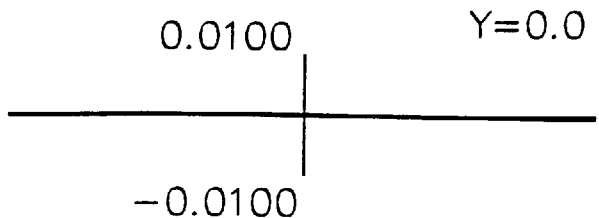 Y=0.0 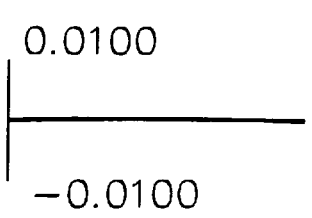
FIG. 14

PROJECTION OPTICAL SYSTEM AND METHOD OF USING SUCH SYSTEM FOR MANUFACTURING DEVICES

BACKGROUND OF THE INVENTION

The present invention relates to a projection optical system for projecting a first object pattern onto a second object substrate for device manufacture. More specifically, the present invention relates to a projection optical system which is suitable to superimposingly photoprint a pattern formed on a first object reticle (mask) for semiconductor or liquid crystal display onto a substrate (e.g., wafer, plate, etc.) as a second object.

As integrated circuits become more miniaturized, specifications for higher performance have been required for projection optical systems used for photoprinting a wafer. To improve resolution for projection optical systems, it has been proposed that shorter λ exposure light be used, or to utilize a larger numerical aperture (NA) of the projection optical system.

In recent years, in order to meet the miniaturization of printing patterns, a light source which emits from g-line (436 nm) through i-line (365 nm) has been popularly used. A light source which emits light of shorter wavelength such as excimer laser (KrF: 248 nm; ArF: 193 nm) is about to be used. Consequently, projection optical systems have been proposed which use exposure light of the above-mentioned wavelength to superimposingly photoprint a pattern from a reticle onto a wafer.

In a projection optical system, it is required that both resolution be improved and levels of image distortion be decreased. The image distortion includes not only the distortion caused by the projection optical system (distortional aberration), but also distortion due to a warped wafer onto which an image is photoprinted on the image side. Also, distortion may be caused by a warped reticle onto which a circuit pattern and the like is drawn on the object side.

The miniaturization has been further advanced lately and the demand for decreasing image distortion has also grown greatly.

Conventionally, a so-called "image-side telecentric optical system" has been developed. This system locates a point of an exit pupil of the optical system at a farther point on the image side in order to decrease the impact of a warped wafer on the image distortion.

It has also been proposed to use a so-called "object side telecentric optical system," which locates a point of an entrance pupil of the optical system at a farther point from the object side. There are also proposals in which techniques to locate the entrance pupil of a projection optical system relatively farther from the object surface are introduced. Japanese patents S63-118115, H4-157412, and H5-173065, etc. are some of these examples.

In the above-mentioned Japanese patents, the so-called "bitelecentric projection optical system" having a telecentric object side and a telecentric image side is disclosed.

Nevertheless, the numerical aperture (NA), which affects resolution, is not large enough and aberration correction capability for each of the aberrations, specifically distortion, is not satisfactory for the bitelecentric projection optical system proposed in each of the above patents.

SUMMARY OF THE INVENTION

An object of the invention is to provide a high performance projection optical system having a large numerical aperture and wide exposure region which is capable of highly accurately correcting various aberrations, specifically distortion, with bitelecentricity.

To achieve the above-mentioned object, a preferred of the present invention includes a projection optical system in which an image of a first object is printed onto a second object, and comprises in order from the first object side:

a first lens group having a positive refractive power with three positive lenses;

a second lens group having a negative refractive power with three negative lenses and one positive lens;

a third lens group having a positive refractive power with three positive lenses and one negative lens;

a fourth lens group having a negative refractive power with three negative lenses; and a fifth lens group having a positive refractive power with six positive lenses and one negative lens wherein:

the first lens group has a subgroup G-1$p$ having at least two positive lenses;

the second lens group has a subgroup G-2$n$ having at least three negative lenses;

the third lens group has a subgroup G-3$p$ having at least three positive lenses;

the fourth lens group has a subgroup G-4$n$ having at least three negative lenses;

the fifth lens group has a subgroup G-5$p$ having at least five positive lenses; and a positive lens G-5$g$ having a concave surface facing the second object side and being closest to the second object side and satisfies the following conditions (1) through (7):

$$0.08 < f1/L < 0.25 \tag{1}$$
$$0.03 < -f2/L < 0.1 \tag{2}$$
$$0.08 < f3/L < 0.3 \tag{3}$$
$$0.035 < -f4/L < 0.11 \tag{4}$$
$$0.1 < f5p/L < 0.25 \tag{5}$$
$$0.07 < f5g/L < 0.21 \tag{6}$$
$$0.25 < R5g/L < 0.83 \tag{7}$$

where:

L is the distance from the first object to the second object (an overall distance);

f1 is the focal length of the subgroup G-1$p$ of the first lens group;

f2 is the focal length of the subgroup G-2$n$ of the second lens group;

f3 is the focal length of the subgroup G-3$p$ of the third lens group;

f4 is the focal length of the subgroup G-4$n$ of the fourth lens group;

f5$p$ is the focal length of the subgroup G-5$p$ of the fifth lens group;

f5$g$ is the focal length of the subgroup G-5$g$ of the fifth lens group; and

R5$g$ is the radius of curvature of the concave surface of the positive lens G-5$g$ facing the second object side.

Also in an embodiment of the present invention, it is preferable that the fifth lens group has a first concave surface N1 facing the first object side and satisfies the following condition (8):

$$0.125 < -Rn1/L < 0.33 \quad (8)$$

In addition, in a preferable mode of the present invention, the fifth lens group has at least four positive lenses which satisfy the following condition (9):

$$-10 < (r1+r2)/(r1-r2) < -0.1 \quad (9)$$

where:
- r1 is the radius of curvature of at least four positive lens of the first object side; and
- r2 is a radius of curvature of at least four positive lens of the second object side.

Moreover in another preferable mode of the present invention, the fifth lens group has a second concave surface N2 facing the second object side, and a third concave surface N3 facing the second object side and being located closer to the second object side than the second concave surface N2. This mode preferably satisfies the following conditions (10) and (11):

$$0.16 < Rn2/L < 0.38 \quad (10)$$

$$0.055 < Rn3/L < 0.11 \quad (11)$$

where:
- Rn2 is the radius of curvature of the second concave surface N2; and
- Rn3 is the radius of curvature of the third concave surface N3.

In yet another embodiment of the present invention, the second lens group has at least one positive lens and satisfies the following condition (12):

$$0.23 < -Rp1/L < 0.5 \quad (12)$$

where:
- the radius of curvature of the surface of the positive lens facing the second object is Rp1.

BRIEF DESCRIPTION OF THE DRAWINGS

The above and other objects, features, and advantages of the present invention will become more apparent from the following description when taken in conjunction with the accompanying drawings, in which:

FIG. 11 is a transverse aberration diagram for the projection optical system of Embodiment 3.

FIG. 14 is a transverse aberration diagram for the projection optical system of Embodiment 4.

DESCRIPTION OF THE PREFERRED EMBODIMENTS

Figure 3:
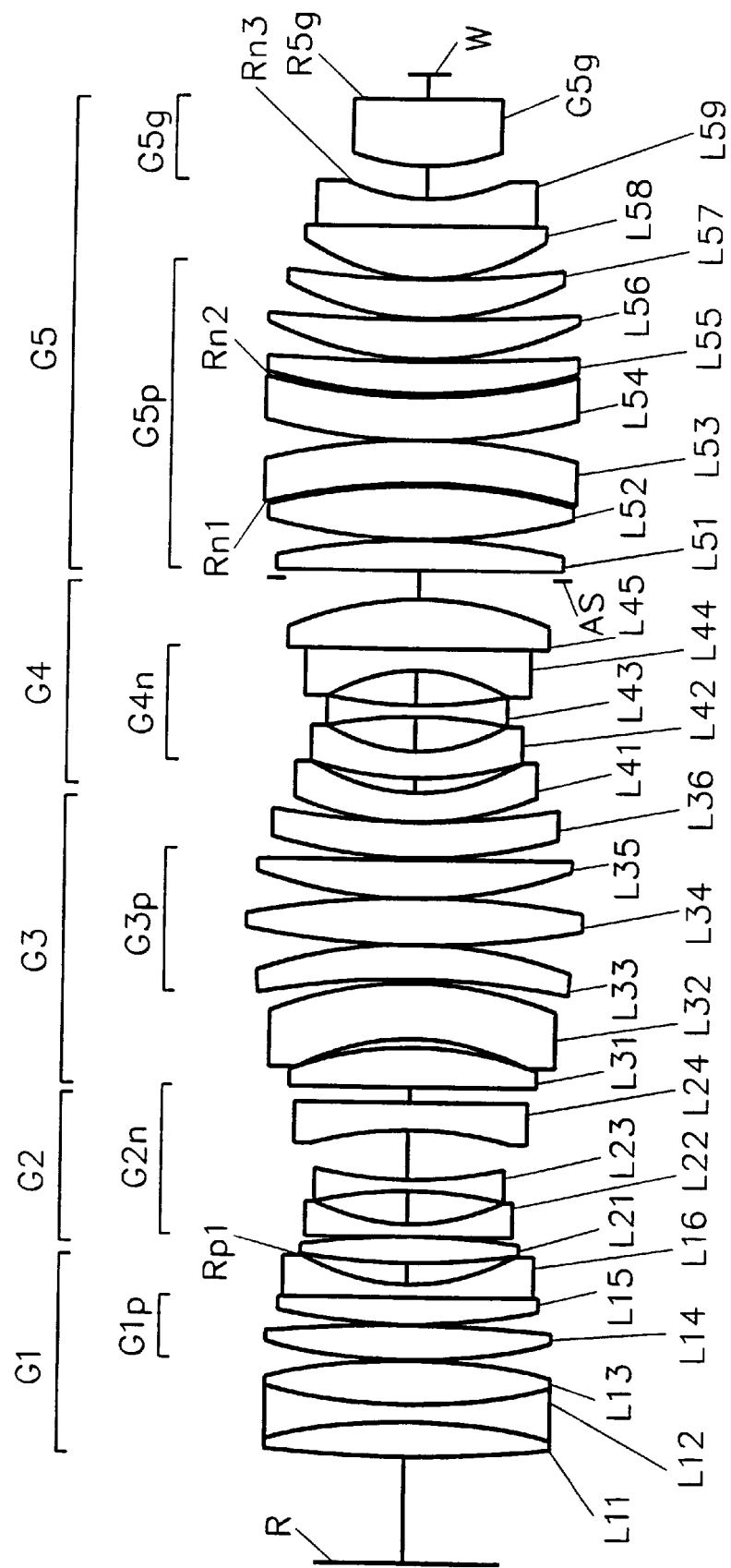
FIG. 3 is the lens layout of a projection optical system of Embodiment 1 of the present invention.
Figure 4:
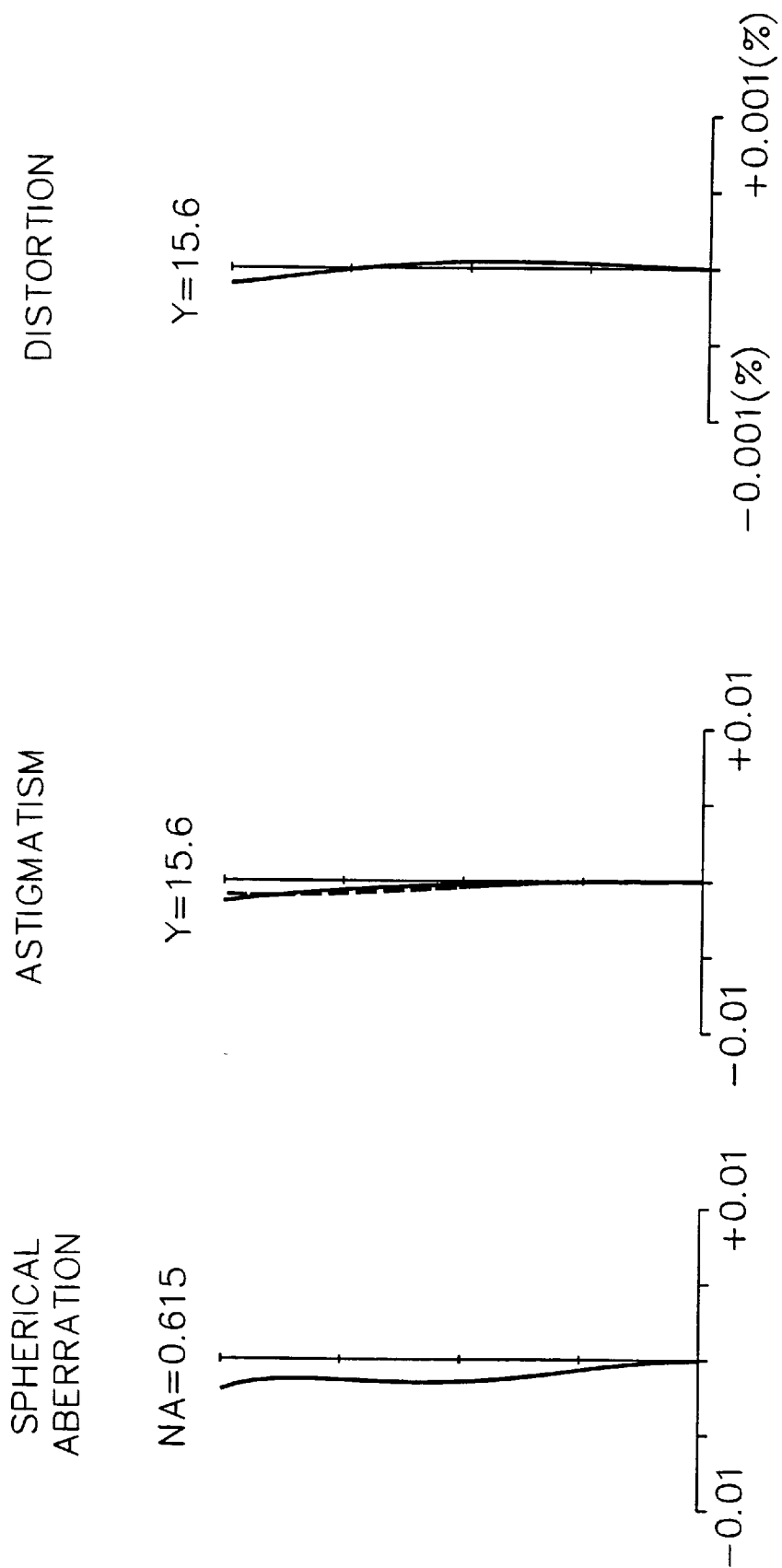
FIG. 4 is a longitudinal aberration diagram for the projection optical system of Embodiment 1.
Figure 5:
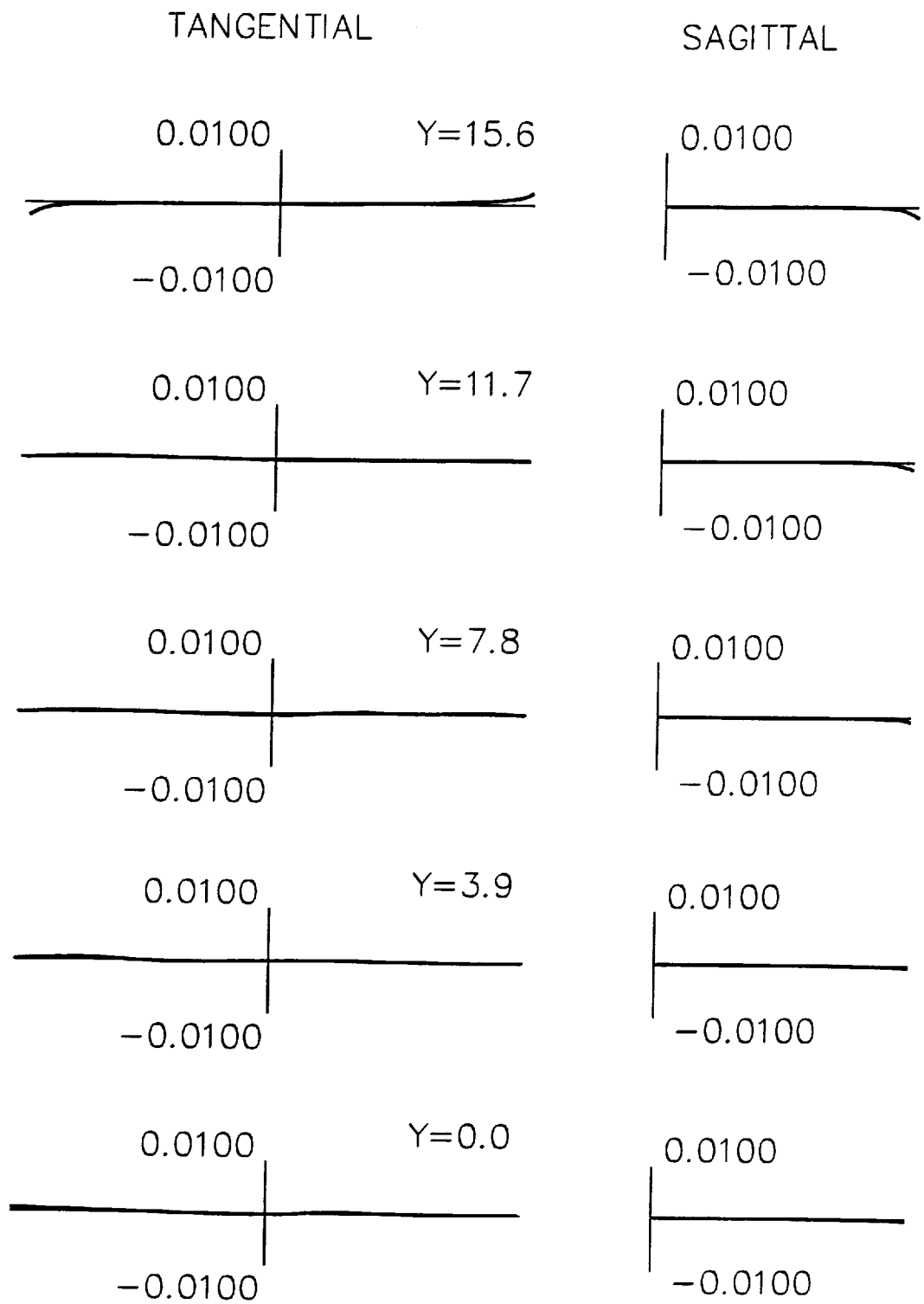
FIG. 5 is a transverse aberration diagram for the projection optical system of Embodiment 1.

To understand the optics of the projection optical system incorporating the principles of the present invention, refer to FIG. 3. The present invention is configured such that the projection optical system has at least, in order from the first object side (reticle R):
- a first lens group G1 having a positive refractive power;
- a second lens group G2 having a negative refractive;
- a third lens group G3 having a positive refractive;
- a fourth lens group G4 having a negative refractive power; and
- a fifth lens group G5 having a positive refractive power.

The first lens group G1, having a positive refractive power, guides the telecentric beam (which has a principal ray parallel to the optical axis of the projection optical system) emitted from the first object to the lens groups behind the second lens group, G2, and generates positive distortions in advance to correct negative distortions generated by the following lens groups, especially the second, the fourth, and the fifth lens groups, which are arranged closer to the second object side than the first lens group G1.

Also, the third lens group G3, having a positive refractive power, generates positive distortions to correct negative distortions generated by the second, the fourth, and the fifth lens groups, G2, G4, and G5, respectively. When viewed from the second object side (right-hand side in FIG. 3), the third lens group G3 and the second lens group G2 form a telephoto system having refractive powers in a positive-negative arrangement which prevents the entire length of the projection lens system from becoming large in order to provide the desired correction.

The second and the fourth lens group G2 and G4, having negative refractive powers, contribute greatly toward correcting the Petzval sum to provide a flat image.

The fifth lens group G5, having a positive refractive power, is responsible for guiding the beam to the second object for imaging while minimizing spherical aberrations.

Next equations utilized to optimize the overall optics are described herein. As described, the projection optical system incorporating the principles of the present invention is constructed to satisfy the following conditions (1) through (7).

$$0.08 < f1/L < 0.25 \quad (1)$$

$$0.03 < -f2/L < 0.1 \quad (2)$$

$$0.08 < f3/L < 0.3 \quad (3)$$

$$0.035 < -f4/L < 0.11 \quad (4)$$

$$0.1 < f5p/L < 0.25 \qquad (5)$$

$$0.07 < f5g/L < 0.21 \qquad (6)$$

$$0.25 < R5g/L < 0.83 \qquad (7)$$

where:

L is the distance from the first object to the second object (the overall distance);

f1 is the focal length of the subgroup G-1p of the first lens group;

f2 is the focal length of the subgroup G-2n of the second lens group;

f3 is the focal length of the subgroup G-3p of the third lens group;

f4 is the focal length of the subgroup G-4n of the fourth lens group;

f5p is the focal length of the subgroup G-5p of the fifth lens group;

f5g is the focal length of the subgroup G-5g of the fifth lens group; and

R5g is the radius of curvature of the concave surface on the second object side of the positive lens G-5g of the fifth lens group.

Condition (1) defines an appropriate positive refractive power of the subgroup G-1p which is responsible for providing the primary positive refractive power in the first lens group G1. It is not desirable for a value to exceed the upper limit of the condition (1) because then the negative distortion generated in the second, the fourth, and the fifth lens groups cannot be corrected completely. It is also not desirable for a value to be beyond the lower limit of the condition (1) where it may cause a high-order positive distortion.

Condition (2) defines an appropriate negative refractive power of the subgroup G-2n which is responsible for providing the primary negative refractive power in the second lens group G2. It is also not desirable for the value in condition (2) to exceed the upper limit, because the Petzval sum cannot be corrected satisfactorily, thereby deteriorating image flatness. When the value of condition (2) exceeds the lower limit, a positive distortion caused by the second lens group G2 grows too large. It is difficult to correct this large positive distortion through use of only the first and the third lens groups.

Condition (3) defines an appropriate positive refractive power of the subgroup G-3p which is responsible for providing the primary positive refractive power in the third lens group G3. It is not desirable for the value to exceed the upper limit of the equation (3) because the telephoto ratio of the telephoto system, composed of the second lens group G2 and the third lens group G3, increases requiring a longer projection lens system, and generates a small amount of positive distortion in the third lens group G3 which cannot correct the negative distortion generated by the second, the fourth, and the fifth lens groups. It is also not desirable for the value to exceed the lower limit because a high-order spherical aberration is generated, deteriorating imaging performance.

Condition (4) defines an appropriate negative refractive power of the subgroup G-4n which is responsible for providing the primary negative refractive power in the fourth lens group G4. It is not desirable for the value of condition (4) to exceed the upper limit, because in this case, the Petzval sum cannot be corrected sufficiently, deteriorating image flatness. It is also not desirable for the value to exceed the lower limit because high-order spherical aberration may be generated to deteriorate image contrast.

Condition (5) defines an appropriate positive refractive power of the subgroup G-5p which is responsible for the primary positive refractive power in the fifth lens group G5. Now it is not desirable for the value of condition (5) to exceed the upper limit, because in this case, the entire positive refractive power of the fifth lens group becomes too weak. This consequently requires a longer projection lens system. Also, it is not desirable for the value to exceed the lower limit of condition (5), because the levels of negative distortion and negative spherical aberration are amplified, deteriorating the image flatness.

Condition (6) defines an appropriate positive refractive power of the positive lens G-5g arranged closer to the second object side than the subgroup G-5p in the fifth lens group G5. It is not desirable for the value to exceed the upper limit because the refractive power of the positive lens G-5g becomes so weak that the lenses in the fifth lens group G5 closer to the first object side than the positive lens G-5g are imposed a burden of aberration correction. As a result, the image performance is aggravated in terms of spherical aberration or the entire system is required to be longer. When the value exceeds the lower limit of condition (6), the levels of negative distortion and the negative spherical aberration may be amplified, deteriorating the image flatness.

Condition (7) defines an appropriate ratio of the radius of curvature of the concave surface, faced toward the second object side of the positive lens G-5g to object-image length (overall length) of the projection lens system. By having the concave surface face the second object side, a negative spherical aberration is minimized for a beam of higher numerical aperture at the second object side of the positive lens G-5g. Now it is not desirable for the value to exceed the upper limit of condition (7) because a high-order negative spherical aberration is generated on the concave surface which prevents obtaining a larger numerical aperture of the projection lens system. In addition, when the value exceeds the lower limit of condition (7), the beam could not be bent efficiently, since the beam diverges excessively at the concave surface, requiring a lens system which is long in the entire length. In this case, the responsibility to correct aberrations is heavily loaded on other positive lenses in the fifth lens group G5, aggravating the levels of spherical aberration.

In the apparatus incorporating the principles of the present invention, it is desirable for the lens group G5 of the fifth lens group to have the first concave surface whose concave surface N1 faces the first object side; it is also preferable that the radius of curvature Rn1 of the concave surface N1 satisfies the following condition (8):

$$0.125 < -Rn1/L < 0.33 \qquad (8)$$

The first concave surface N1 whose concave surface faces the first object side of the fifth lens group G5 is basically responsible for correcting the negative spherical aberration generated by the positive lens of the fifth lens group G5. In condition (8) an appropriate ratio of the radius of curvature of the first concave surface N1 to image-object distance (overall length) is defined. It is not desirable for the value of condition (8) to exceed the upper limit, because in this case, the negative spherical aberration generated by the positive lens cannot be corrected sufficiently. It is also not desirable for the value to exceed the lower limit because high-order spherical aberration may be generated by over correcting spherical aberration.

Also, in the apparatus incorporating the principles of the present invention, it is preferable that the fifth lens group G5 have at least four positive lenses which satisfy the following condition (9):

$$-10<(r1+r2)/(r1-r2)<-0.1 \qquad (9)$$

where:

r1 is the radius of curvature on the first object side in at least four positive lenses; and r2 is the radius of curvature on the second object side in at least four positive lenses.

The above condition (9) defines the shape of the positive lens included in the fifth lens group G5. When the lens is shaped such that the value of condition (9) exceeds its upper limit, a negative spherical aberration grows too large to be corrected; When the lens is shaped such that the value of equation (9) exceeds its lower limit, the negative distortion grows too large to be corrected. The fifth lens group G5 is arranged closer to the second object side than other lens groups such that a beam with higher numerical aperture passes through the lens group. For this reason when there are less than four positive lenses which satisfy the above condition (9) in the fifth lens group G5, it becomes difficult to simultaneously correct both a spherical aberration in a large numerical aperture and a distortion in a wide exposure range.

Also in the apparatus incorporating the principles of the present invention, it is preferable that the fifth lens group G5 has a second concave surface N2 whose concave surface faces the second object side and a third concave surface N3 whose concave surface faces to the second object side and is located closer to the second object side than the second concave surface N2 and these second and third concave surfaces N2 and N3 satisfy the following conditions (10) and (11):

$$0.16<Rn2/L<0.38 \qquad (10)$$

$$0.055<Rn3/L<0.11 \qquad (11)$$

where:

Rn2 is the radius of curvature of the second concave surface N2; and

Rn3 is the radius of curvature of the third concave surface N3.

The second concave surface N2 and the third concave surface N3 whose concave surfaces face the second object side in the fifth lens group G5 have a function for primarily correcting negative spherical distortion and negative distortion by the positive lens in the fifth lens group G5. The above conditions (10) and (11) define an appropriate radius of curvature ratio between the second concave surface N2 to the object-image length (overall length) and the third concave surfaces N3 to the object-image length (overall length).

It is not desirable for the value to exceed the upper limit of conditions (10) and (11) because negative spherical aberration and distortion remains. When the value exceeds the lower limit, spherical aberration increases excessively, causing a high-order spherical aberration, which is especially not desired.

In the apparatus incorporating the principles of the present invention, when the radius of curvature of the positive lens whose surface faces the second object side in the second lens group G2 is Rp1, it is preferable to satisfy the following condition (12):

$$0.23<-Rp1/L<0.5 \qquad (12)$$

Condition (12) defines the radius of curvature of the convex surface facing the second object side of the positive lens in the second lens group G2 with respect to object-image distance (overall distance). This convex surface is responsible for correcting the negative distortion generated in the second, the fourth, and the fifth lens groups G2, G4, and G5, respectively. It is not desirable for the value of condition (12) to exceed the upper limit, because correction of distortion will be insufficient, leaving a residual negative distortion. Also, it is also not desirable for the value of condition (12) to exceed the lower limit, especially because distortion increases excessively, causing a high-order positive distortion.

Figure 1:
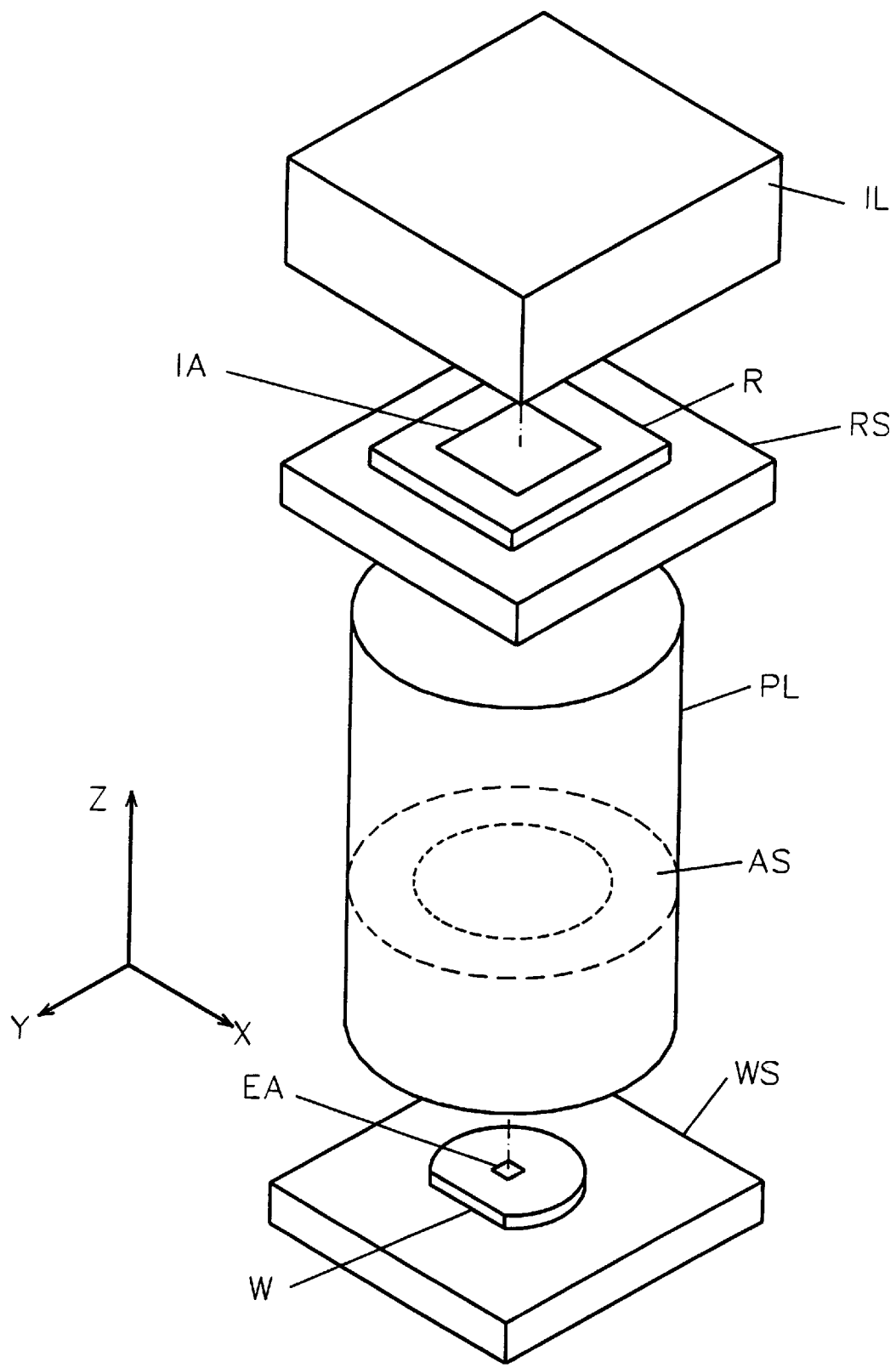
FIG. 1 is a perspective schematic view of an embodiment in which the projection exposure system incorporating the principles of the present invention is applied to a step-and-repeat type projection exposure apparatus.
Figure 2:
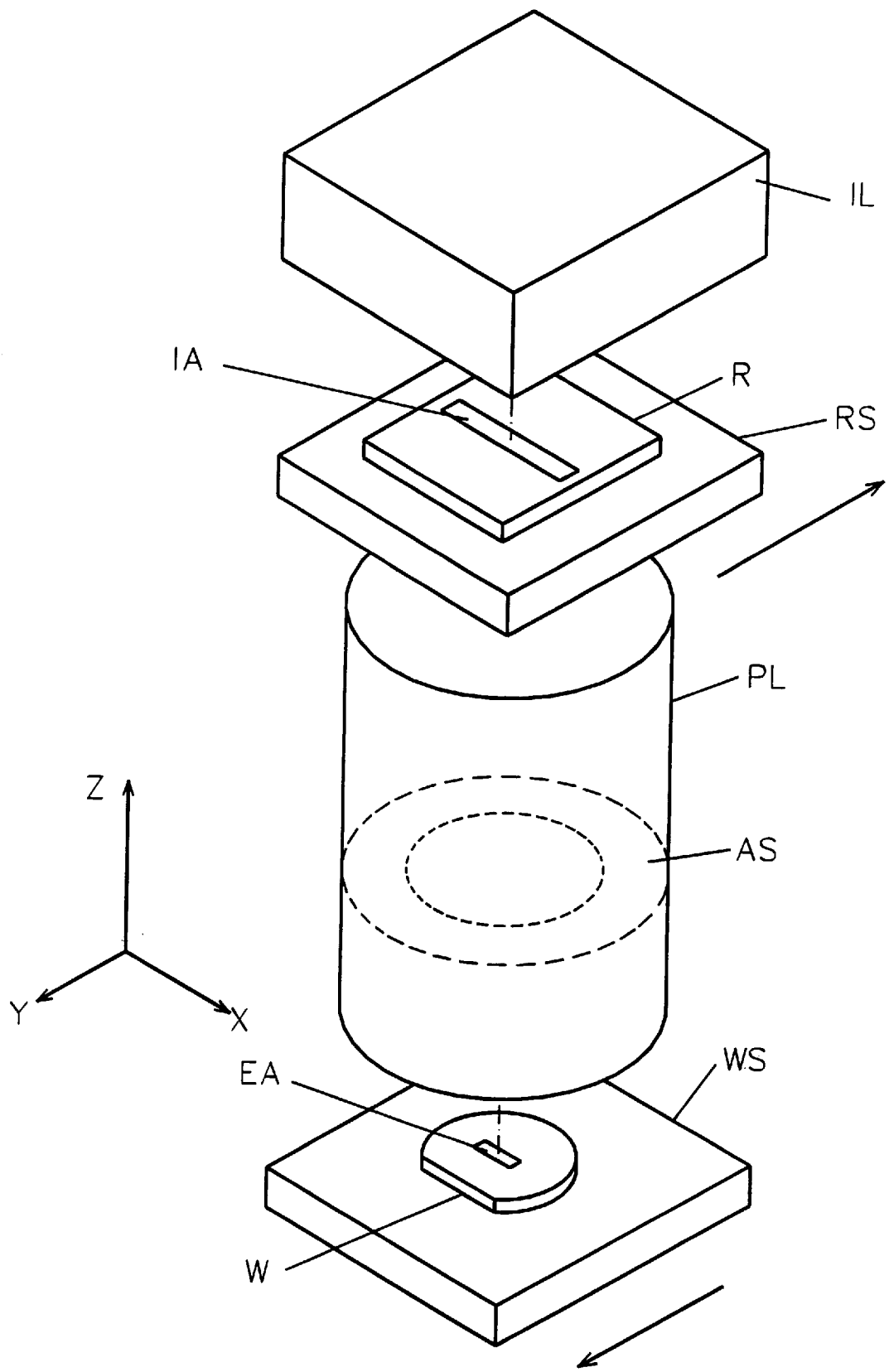
FIG. 2 is a perspective schematic view of an embodiment in which the projection exposure system incorporating the principles of the present invention is applied to a step-and-scan type projection exposure apparatus.

Next, an embodiment of the projection optical system of the present invention applied to a projection exposure system is described referring to the figures. FIG. 1 is a perspective view showing an embodiment of the projection optical system of the present invention applied to a step-and-repeat type projection exposure system; FIG. 2 is a perspective view showing an embodiment of the projection optical system of the present invention applied to a step-and-scan type projection exposure system.

Projection exposure apparatus of FIGS. 1 and 2 are used in an exposing process of forming an IC pattern for integrated circuits and liquid crystal panels, for example.

First, in FIG. 1, a reticle R (the first object) as a mask substrate on which a predetermined circuit pattern is drawn, is arranged on the surface of an object of the projection optical system PL. A wafer W (the second object) is arranged on the image surface of the projection optical system PL. The reticle R is held on a reticle stage RS and the wafer W is held on a wafer stage WS. Both stages RS and WS are movable in the XY direction in the figures. Also, above the reticle R (in the Z-direction side,) an illumination optical system IL is arranged for uniformly irradiating the illumination region 1A of a reticle R with exposure light in the ultraviolet band. The illumination optical system IL in this embodiment supplies i-line ($\lambda$=365 nm) in the ultraviolet light band.

With the above configuration, exposure light in the ultraviolet band supplied by the illumination optical system IL irradiates the illumination region IA on the reticle R uniformly. The exposure light which passes through the reticle R forms a light source image at an aperture stop AS of the projection optical system PL. That is, the reticle R is illuminated by Kohler illumination technique using the illumination optical system IL. An image within the illumination region IA of the reticle R is formed on the exposure region EA of the wafer W and the circuit pattern on the reticle R is printed onto the wafer W.

Next, the difference between the embodiment shown in FIG. 2 and that of FIG. 1 is that in FIG. 2 the reticle stage RS holding the reticle R and the wafer stage WS holding the wafer W scan in the opposite directions during the exposure. With this function, the image of the circuit pattern on the reticle R is scan-exposed onto the wafer W.

In the above embodiment shown in FIGS. 1 and 2, the projection optical system PL is substantially telecentric at the first object side (reticle R side) and the second object side (wafer W side) and has a reduction magnification. That is, the image formed on the wafer W is smaller in size than the pattern on the reticle R.

As noted above, FIGS. 1 and 2 are schematic diagrams to explain the projection optical system in the exposure apparatus. These diagrams have been made simple in order to avoid unnecessarily complicating the drawings. For a more complete description of such exposure systems, reference may be made to U.S. Pat. Nos. 4,918,583, 5,245,384, 4,497,015, and 5,420,417, assigned to the assignee of the present invention. The disclosures of such patents are hereby incorporated by reference.

Next, embodiments of the projection optical system incorporating the principles of the present invention are described referring to FIGS. 3 through 14. FIGS. 3, 6, 9 and 12 show the cross-section of the lens projection optical system of Embodiments 1 through 3 respectively; FIGS. 4, 7, 10 and 13 are diagrams showing longitudinal aberrations of the projection optical system of Embodiments 1 through 4 respectively; FIGS. 5, 8, 11 and 14 show the transverse aberrations (lateral aberrations) of the projection optical system of Embodiments 1 through 4 respectively.

EMBODIMENT 1

In FIG. 3, the projection optical system of Embodiment 1 comprises, in the order from the first object (reticle R):

a first lens group G1 having a positive refractive power;

a second lens group G2 having a negative refractive power;

a third lens group G3 having a positive refractive power;

a fourth lens group G4 having a negative refractive power; and a fifth lens group G5 having a positive refractive power.

The first lens group G1 is comprised of, in order from the first object side, a positive biconvex lens L11, a negative biconcave lens L12, two biconvex positive lenses L13 and L14, a plano-convex positive lens L15 whose convex surface faces the first object side, and a plano-concave negative lens L16 whose concave surface faces the second object side. A subgroup G-1p having a positive refractive power in the first lens group G1 is comprised of two biconvex positive lenses L13 and L14.

The second lens group G2 is comprised of, in order from the first object side, a positive biconvex lens L21, a plano-negative concave lens L22 whose concave surface faces the second object side, a negative biconcave lens L23 and a plano-concave negative lens L24 whose concave surface faces the first object side. A subgroup G-2n having a negative refractive power in the second lens group G2 is comprised of three negative lenses L22 through L24.

The third lens group G3 is comprised of, in order from the first object side, a plano-convex positive lens L31 whose convex surface faces the second object side, a meniscus negative lens L32 whose concave surface faces the first object side, a meniscus positive lens L33 whose concave surface faces the first object side, two positive convex lenses L34 and L35, and a meniscus positive lens L36 whose convex surface faces the first object side. A subgroup G-3p having a positive refractive power in the third lens group G3 is comprised of three positive lenses L33 through L35.

The fourth lens group G4 is comprised of, in order from the first object side, a convex meniscus lens L41 whose convex surface faces the first object side, a meniscus negative lens L42 whose convex surface faces the first object side, a biconcave negative lens L43, a meniscus negative lens L44 whose concave surface faces the first object side, and a meniscus positive lens L45 whose convex surface faces the second object side. A subgroup G-4n having negative refractive power in the fourth lens group G4 is comprised of three negative lenses L42 through L44.

The fifth lens group G5 is comprised of, in order from the first object side, a meniscus positive lens L51 whose concave surface N1 faces the first object side, a biconvex positive lens L52, a meniscus negative lens L53 whose concave surface Ni faces the first object side, a meniscus negative lens L54 whose concave surface N2 faces the second object side, a biconvex positive lens L55, three meniscus positive lenses L56 through L58 whose convex surface faces the first object side, a meniscus negative lens L59 whose concave surface N3 faces the second object side, and a meniscus positive lens G-5g whose concave surface faces the second object side. A subgroup G-5p in the fifth lens group G5 having a positive refractive power is comprised of positive lenses L51 and L52, negative lenses L53 and L54, and positive lenses L55 through L57.

In the projection optical system of the first embodiment, an aperture stop AS is arranged between the fourth lens group G4 and the fifth lens group G5.

EMBODIMENT 2

Figure 6:
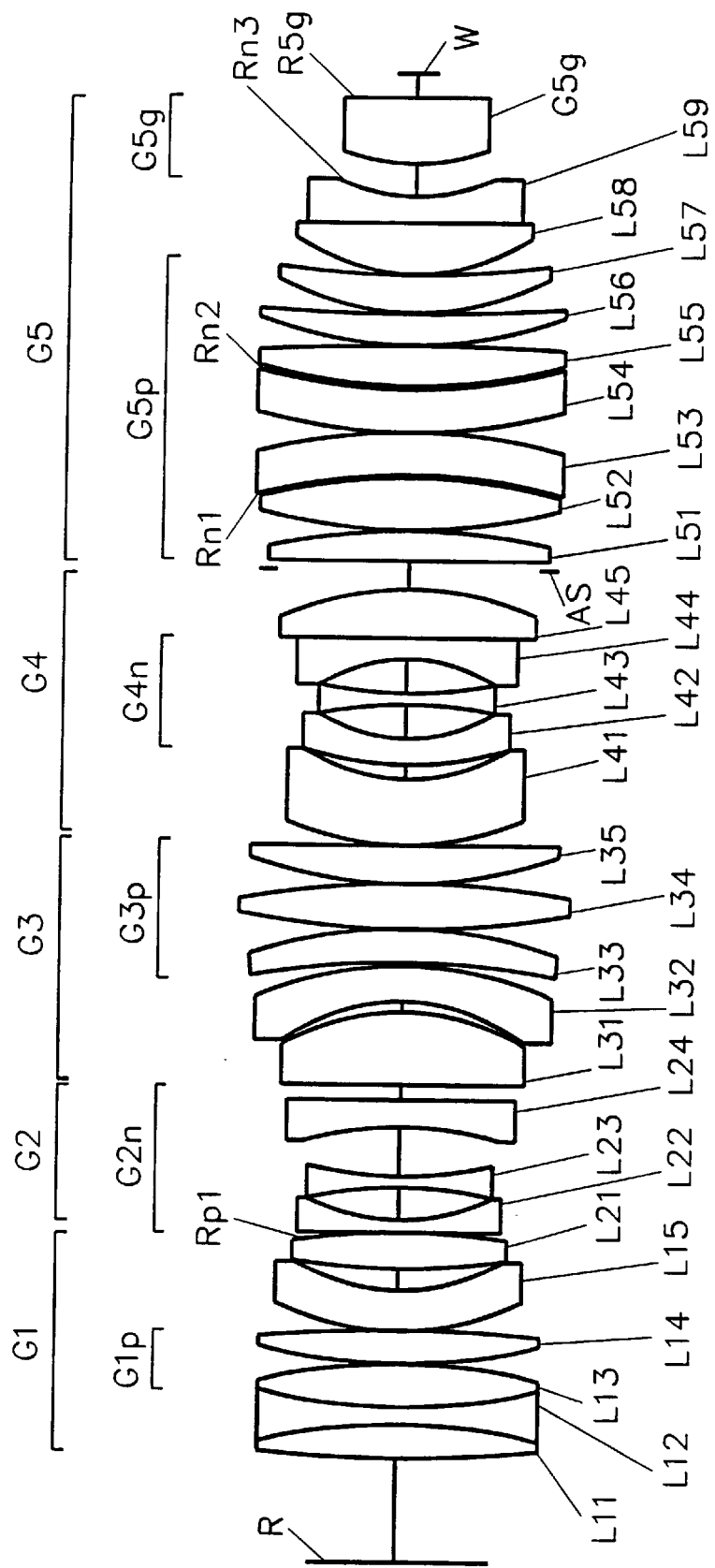
FIG. 6 is the lens layout of a projection optical system of Embodiment 2 of the present invention.
Figure 7:
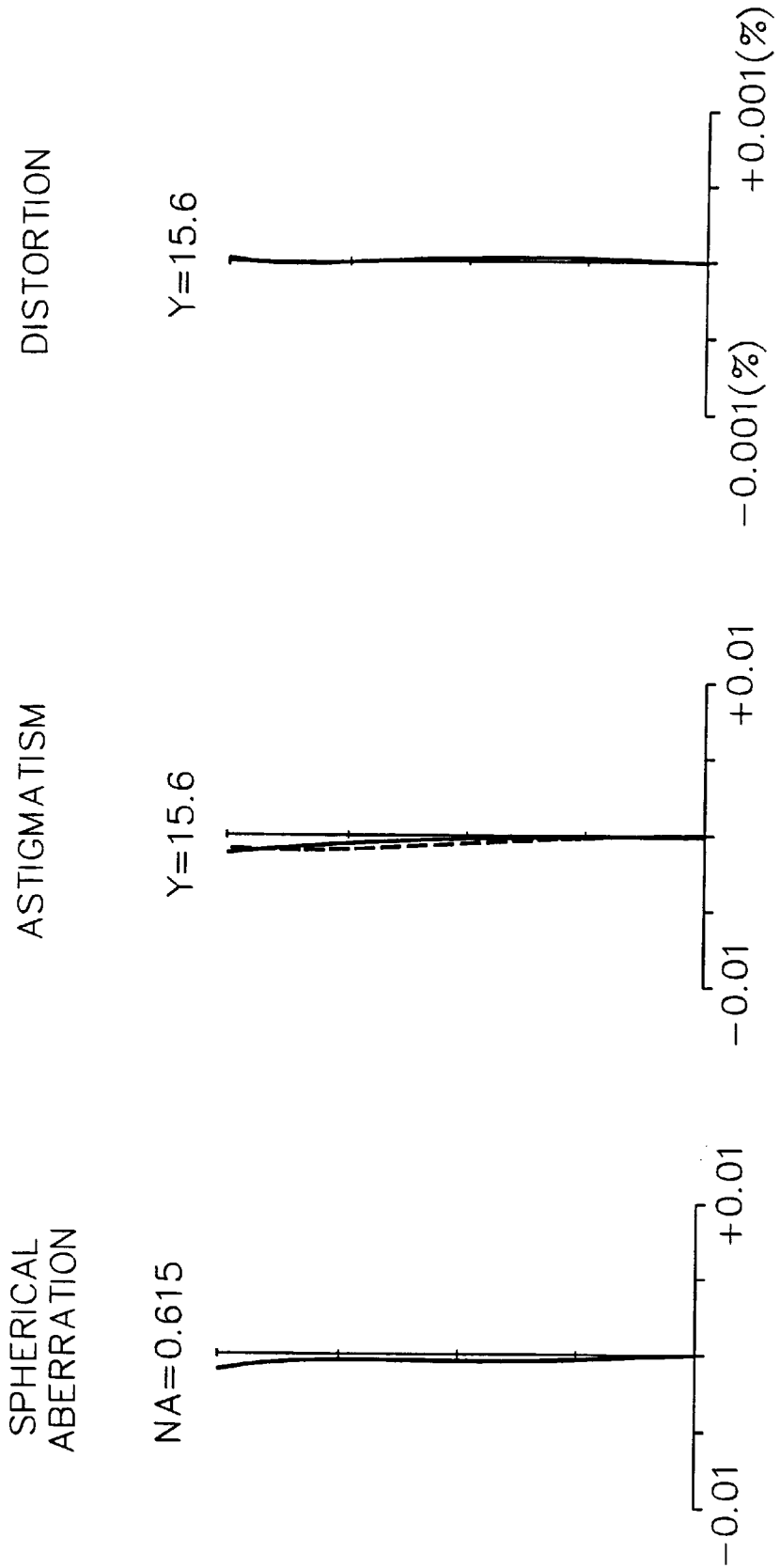
FIG. 7 is a longitudinal aberration diagram for the projection optical system of Embodiment 2.
Figure 8:
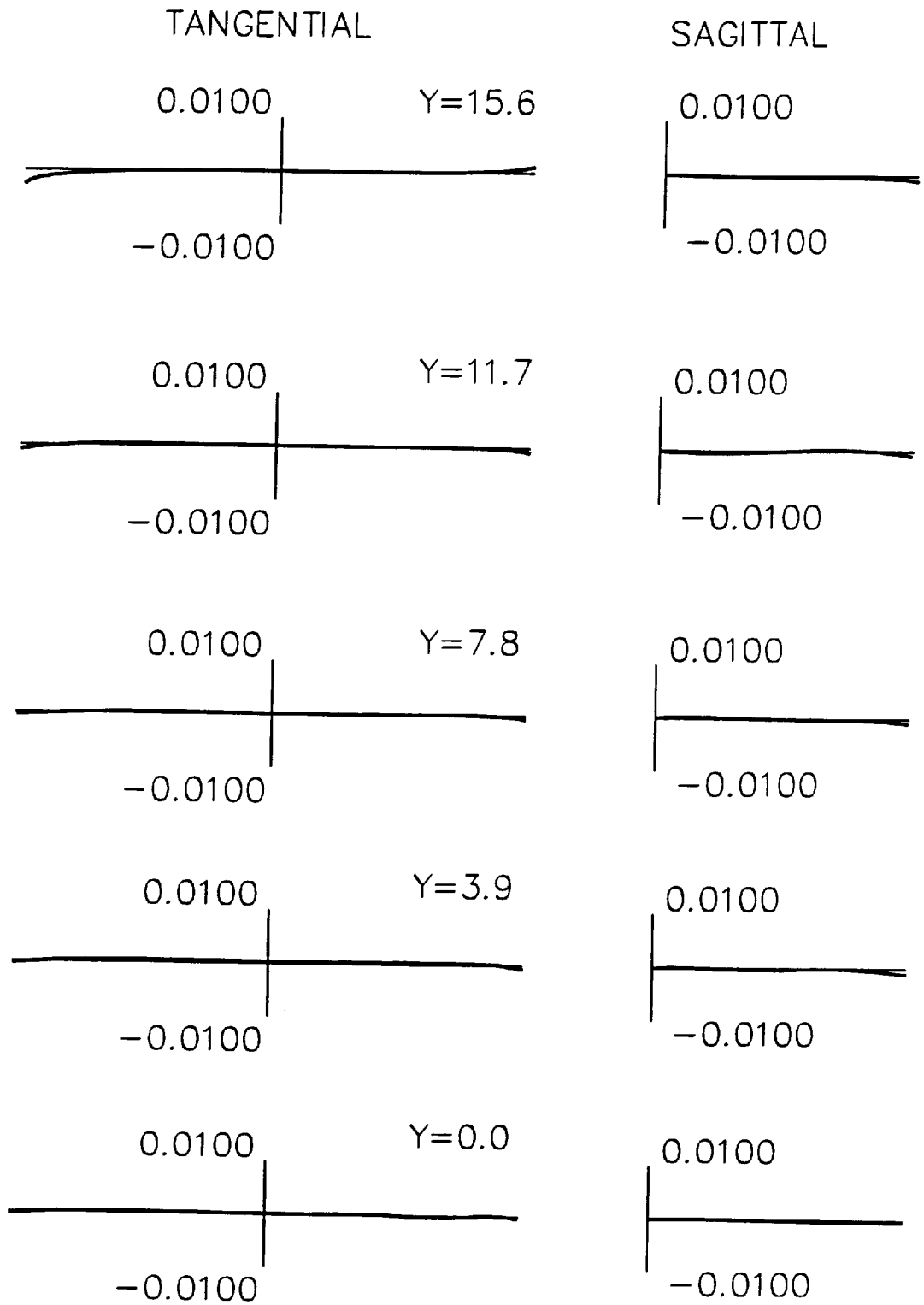
FIG. 8 is a transverse aberration diagram for the projection optical system of Embodiment 2.

In FIG. 6, the projection optical system of Embodiment 2 is comprised of, in order from the first object (reticle R) side, a first lens group G1 having a positive refractive power, a second lens group G2 having a negative refractive power, a third lens group G3 having a positive refractive power, a fourth lens group G4 having a negative refractive power, and a fifth lens group G5 having a positive refractive power.

The first lens group G1 is comprised of, in order from the first object side, a biconvex positive lens L11, a biconcave negative lens L12, two biconvex positive lenses L13 and L14, and a meniscus negative lens L15 whose concave surface faces the second object side. In the first lens group G1, a subgroup G-1p having a positive refractive power in the first lens group G1 is comprised of two positive lenses L13 and L14.

The second lens group G2 is comprised of, in order from the first object side, a biconvex positive lens L21, a plano-concave negative lens L22 whose concave surface faces the second object side, a biconcave negative lens L23 and a plano-concave negative lens L24 whose concave surface faces the first object side. A subgroup G-2n having a negative refractive power in the second lens group G2 is comprised of three negative lenses L22 through L24.

The third lens group G3 is comprised of, in order from the first object side, a meniscus positive lens L31 whose concave surface faces the first object side, a meniscus negative lens L32 whose concave surface faces the first object side, a meniscus positive lens L33 whose concave surface faces the first object side, a biconvex positive lens L34, and a meniscus positive lens L35 whose convex surface faces the first object side. A subgroup G-3p having a positive refractive power in the third lens group G3 is comprised of three positive lenses L33 through L35.

The fourth lens group G4 is comprised of, in order from the first object side, a meniscus positive lens L41 whose convex surface faces the first object side, a meniscus negative lens L42 whose convex surface faces the first object side, a biconcave negative lens L43, a meniscus negative lens L44 whose concave surface faces the first object side, and a meniscus positive lens L45 whose convex surface faces the second object side. A subgroup G-4n having a negative refractive power in the fourth lens group G4 is comprised of three negative lenses L42 through L44.

The fifth lens group G5 is comprised of, in order from the first object side, a meniscus positive lens L51 whose concave surface faces the first object side, a biconvex positive lens L52, a meniscus negative lens L53 whose concave surface N1 faces the first object side, a meniscus negative lens L54 whose concave surface N2 faces the second object side, a biconvex positive lens L55, and thee meniscus positive lenses L56 through L58 whose convex surface faces the first object side, a meniscus negative lens L59 whose concave surface N3 faces the second object side, and a meniscus positive lens G-5g whose concave surface faces the second object side. A subgroup G-5p in the fifth lens group having a positive refractive power is constructed with positive lenses L51 and L52, negative lenses L53 and L54, and positive lenses L55 through L57.

In the projection optical system of Embodiment 2, an aperture stop AS is arranged between the fourth lens group G4 and the fifth lens group G5.

EMBODIMENT 3

Figure 9:
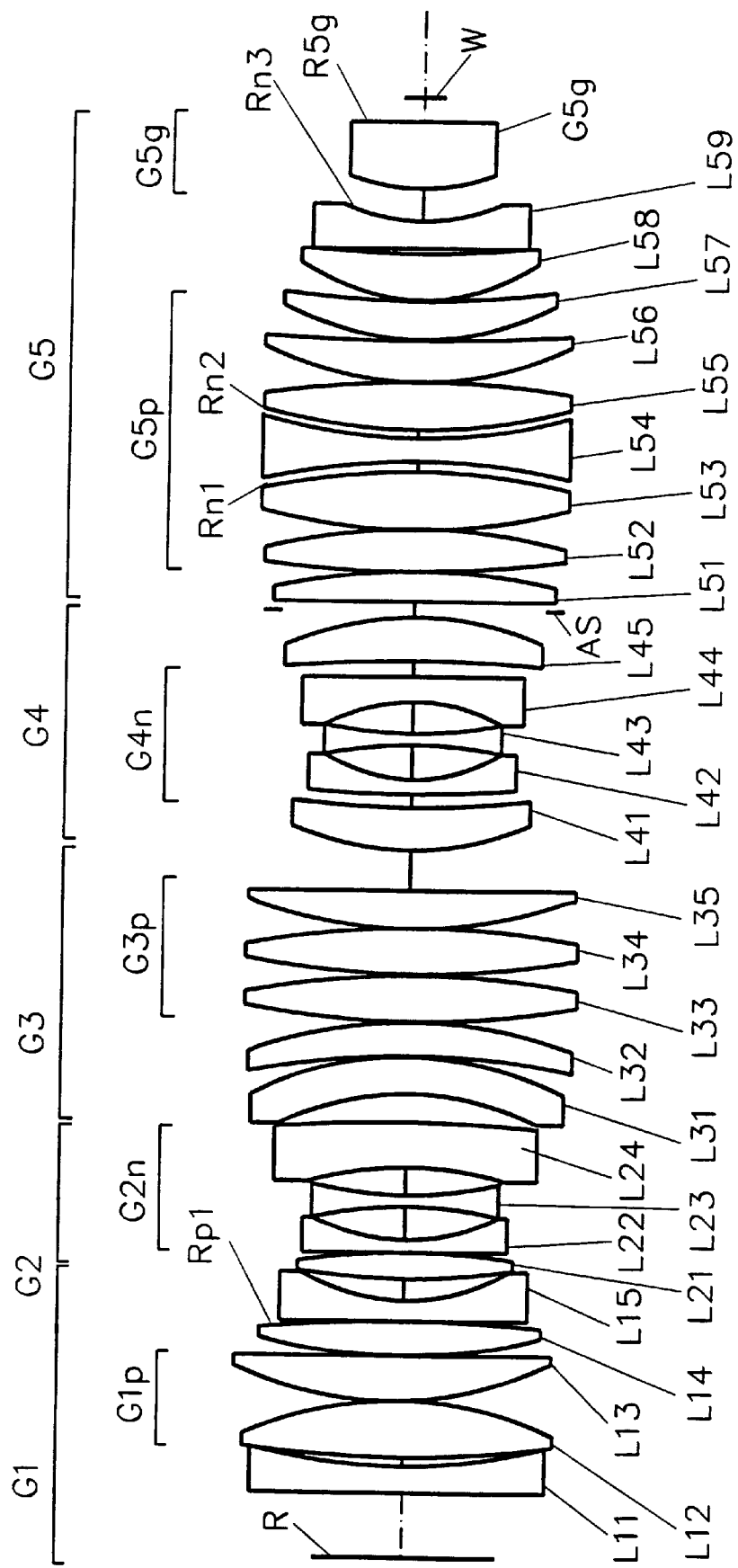
FIG. 9 is the lens layout of a projection optical system of Embodiment 3 of the present invention.
Figure 10:
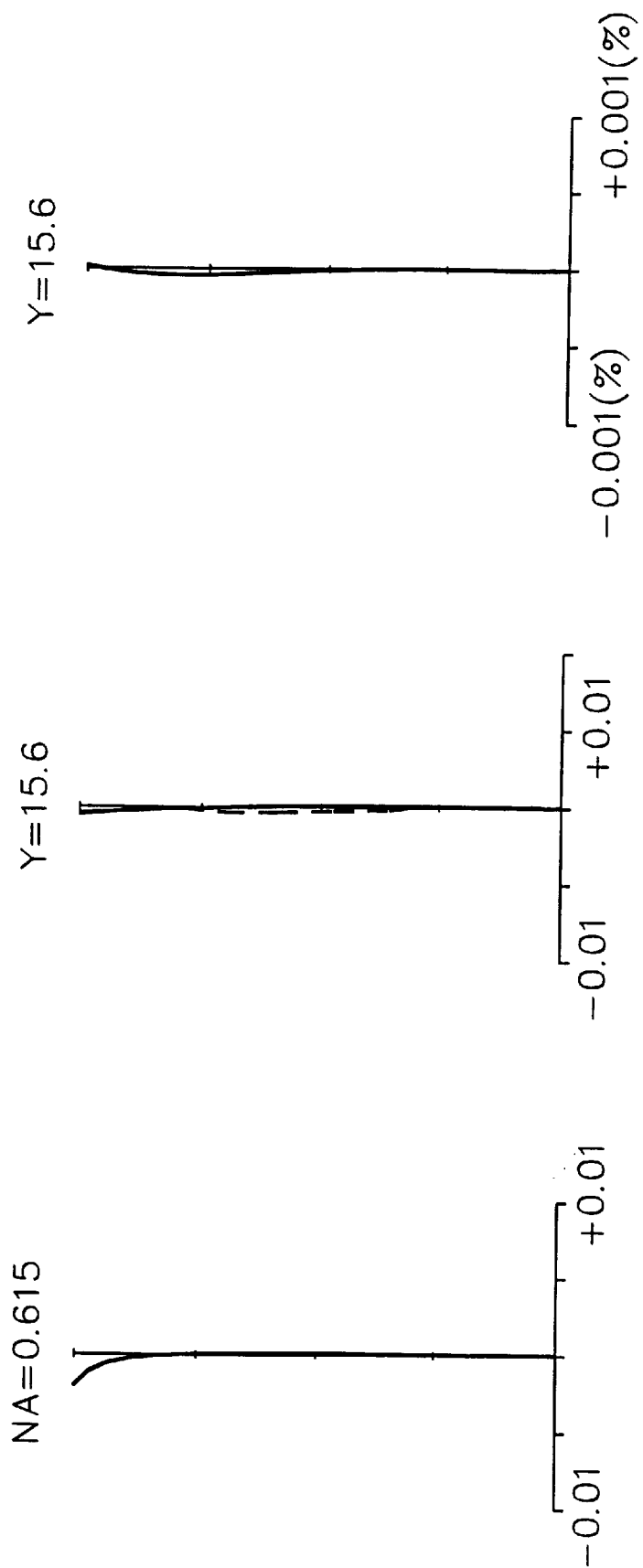
FIG. 10 is a longitudinal aberration diagram for the projection optical system of Embodiment 3.

In FIG. 9, the projection optical system of Embodiment 3 is comprised of, in order from the first object (reticle R), a first lens group G1 having a positive refractive power, a second lens group G2 having a negative refractive power, a third lens group G3 having a positive refractive power, a fourth lens group G4 having a negative refractive power, and a fifth lens group G5 having a positive refractive power.

The first lens group G1 of Embodiment 3 is comprised of, in order from the first object side, a meniscus negative lens L11 whose convex surface faces the first object side, three biconvex positive lenses L12 through L14, and a plano-concave negative lens L15 whose concave surface faces the second object side. A subgroup G-1p having a positive refractive power in the first lens group G1 is comprised of two positive lenses L12 and L13.

The second lens group G2 is comprised of, in order from the first object side, a biconvex positive lens L21, a plano-concave negative lens L22 whose concave surface faces the second object side, a biconcave negative lens L23, and a meniscus negative lens L24 whose concave surface faces the first object side. A subgroup G-2n having a negative refractive power is comprised of the three negative lenses L22 through L24.

The third lens group G3 is comprised of, in order from the first object side, two meniscus positive lenses L31 and L32 and three biconvex positive lenses L33 through L35. A subgroup G-3p having a positive refractive power is constructed with the three positive lenses L33 through L35.

The fourth lens group G4 is comprised of, in order from the first object side, a meniscus positive lens L41 whose convex surface faces the first object side, a meniscus negative lens L42 whose convex surface faces the first object side, a biconcave negative lens L43, a plano-concave negative lens L44 whose concave surface faces the first object side, and a meniscus positive lens L45 whose convex surface faces the second object side. A subgroup G-4n having a negative refractive power in the fourth lens group G4 is comprised of three negative lenses L42 through L44.

The fifth lens group G5 is comprised of, in order from the first object side, a meniscus positive lens L51 whose concave surface faces the first object side, two biconvave positive lenses L52 and L53, a biconvex negative lens L54 having both a concave surface N1 which faces the first object side and a concave surface N2 whose surface faces the second object side, a biconvex positive lens L55, three meniscus positive lenses L56 through L58 whose convex surface faces the first object side, a meniscus negative lens L59 whose concave surface N3 faces the second object side, and a meniscus positive lens G-5g whose concave surface faces the second object side. A subgroup G-5p having a positive refractive power in the fifth lens group G5 is constructed with positive lenses L51 through L53, negative lens L54, and positive lenses L55 through L57.

Note that in the projection optical system of Embodiment 3, an aperture stop AS is arranged between the fourth lens group G4 and the fifth lens group G5.

EMBODIMENT 4

Figure 12:
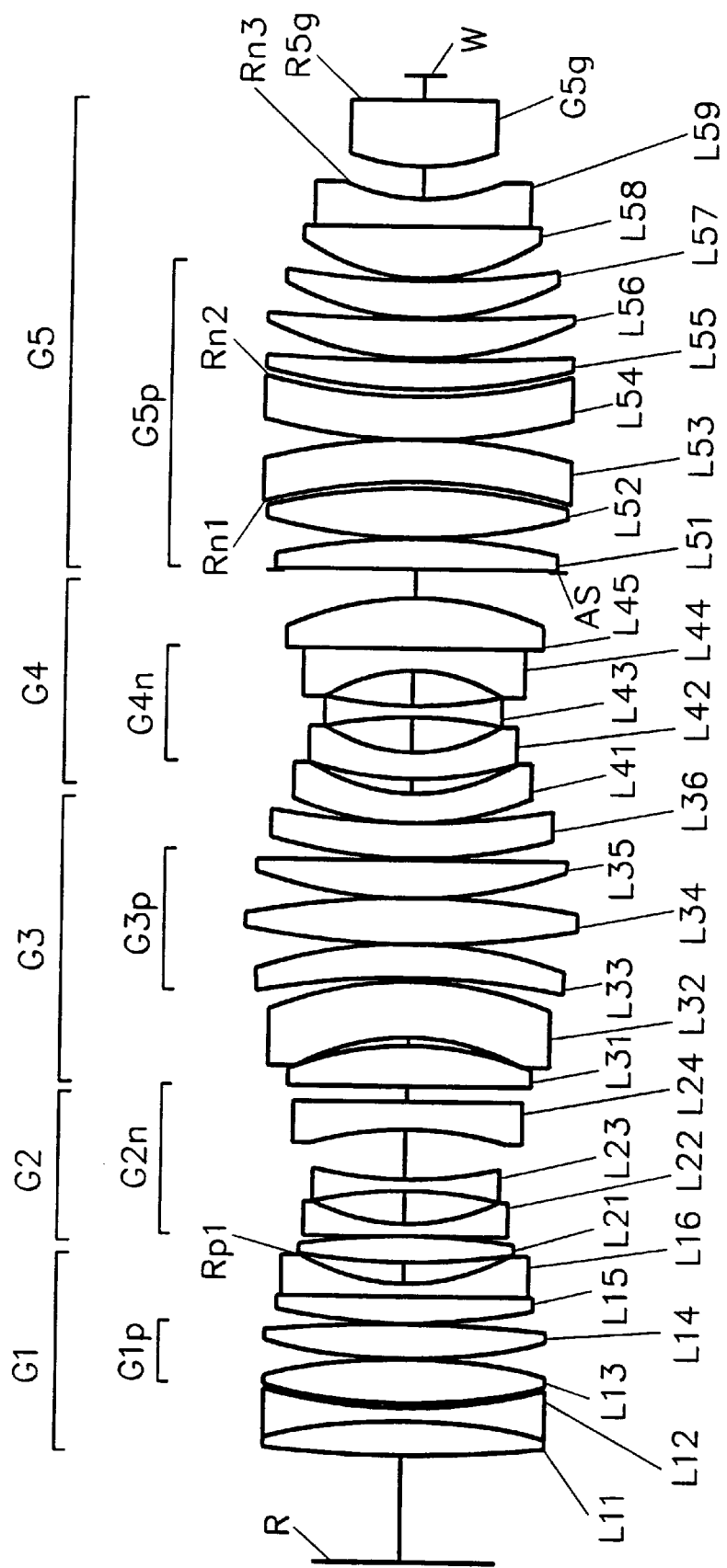
FIG. 12 is the lens layout of a projection optical system of Embodiment 4 of the present invention.
Figure 13:
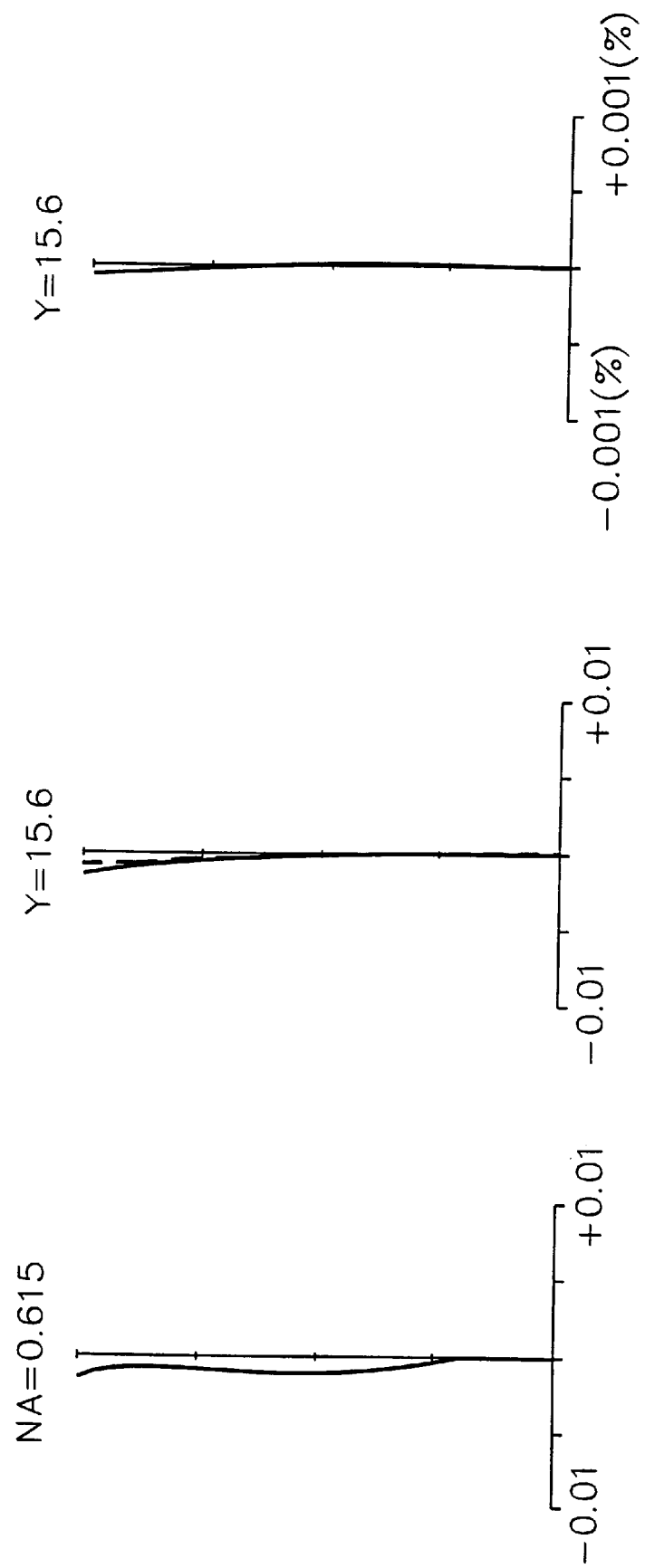
FIG. 13 is a longitudinal aberration diagram for the projection optical system of Embodiment 4.

In FIG. 12, the projection optical lens system of Embodiment 4 is comprised of, in order from the first object (reticle R) side, a first lens group G1 having a positive refractive power, a second lens group G2 having a negative refractive power, a third lens group G3 having a positive refractive power, a fourth lens group G4 having a negative power, and a fifth lens group G5 having a positive refractive power.

The first lens group G1 is comprised of, in order from the first object side, a biconvex positive lens L11, biconcave negative lens L12, two biconvex positive lenses L13 and L14, a plano-convex positive lens L15 whose convex surface faces to the first object side, and a plano-concave negative lens L16 whose concave surface faces the second object side. In the first lens group G1, a sub-group G1p having a positive refractive power is constructed with two biconvex positive lenses L13 and L14.

The second lens group G2 is comprised of, in order from the first object side, a biconvex positive lens L21, a plano-concave negative lens L22 whose concave surface faces the second object side, a biconcave negative lens L23, and a plano-concave negative lens L24 whose concave surface faces the first object side. In the second lens group G2, a sub-group G2n having a negative refractive power is constructed with three negative lenses L22 through L24.

The third lens group G3 is comprised of, in order from the first object side, a convex positive lens L31 whose convex surface faces the second object side, a meniscus negative lens L32 whose concave surface faces the first object side, a meniscus positive lens L33 whose concave surface faces the first object side, two biconvex positive lenses L34 and L35, and a meniscus positive lens L36 whose convex surface faces the first object side. In the third lens group G3, a sub-group G3p having a positive refractive power is constructed with three positive lenses L33 through L35.

The fourth lens group G4 is comprised of, in order from the first object side, a meniscus positive lens L41 whose convex surface faces the first object side, a meniscus negative meniscus lens L42 whose convex surface faces the first object side, a biconcave negative lens L43, a meniscus negative lens L44 whose concave surface faces the first object side, and a meniscus positive lens L45 whose convex surface faces the second object side. In the fourth lens group G4, a sub-group G4n having a negative refractive power is constructed with three negative lenses L42 through L44.

The fifth lens group G5 is comprised of, in order from the first object side, a meniscus positive lens L51 whose concave surface faces the first object side, a biconvex positive lenses L52, a meniscus negative lens L53 whose concave surface N1 faces the first object side, a meniscus negative lens L54 whose concave surface N2 faces the second object side, a biconvex positive lens L55, three meniscus positive lenses L56 through L58 whose convex surfaces face the first object side, a meniscus negative lens L59 whose concave surface N3 faces the second object side, and a meniscus positive lens G5g whose concave surface faces the second object side. In the fifth lens group G5, a sub-group G5p having a positive refractive power is constructed with positive lenses L51 and L52, negative lenses L53 and L54, and positive lenses L55 through L57.

Note that in the projection optical system of Embodiment 4, an aperture stop AS is arranged between the fourth lens group G4 and the fifth lens group G5.

Various values and parameters which correspond to various conditions are shown in the following Tables 1 through 6.

In each table, the numbers in the left-hand column denote the order from the first object side (reticle R side); r, the radius of curvature of the lens surface; d, lens surface separation length; n, a refractive index at 365 nm; d0, the lens separation distance between the lens surface (the first lens surface) of the first lens group G1 closest to the first object side (reticle R side); WD, the distance between the surface of a lens of the fifth lens group G5 which is closest to the second object side (wafer W side) and the second object surface (wafer W surface); β, the (lateral) magnification of the projection optical system; NA, the numerical aperture of the projection optical system on the second object side; φEX is the radius of the exposure region on the second object surface (the surface of the plate P); L is an object-image distance (overall distance), the distance (between the first object (reticle R) and the second object (wafer W)); f1, the focal length of the subgroup G-1p in the first lens group G1; f2, the focal length of the subgroup G-2n of the second lens group G2; f3, the focal length of the subgroup G-3p in the third lens group G3; f4, the focal length of the subgroup G-4n of the fourth lens group G4; and f5p is the focal length of the subgroup G-5p in the fifth lens group G5. In each of the tables, f5g is the focal length of the positive lens G-5g in the fifth lens group G5; R5g is the radius of curvature of the concave surface of the positive lens G-5g in the fifth lens group G5 on the second object side (wafer W side); Rn1 is the radius of curvature of the first concave surface N1 whose concave surface faces the first object side (reticle R side) of the fifth lens group G5; Rn2 is the radius of curvature of the second concave surface N2 whose concave surface faces the second object side (wafer W side) in the fifth lens group G5; Rn3 is the radius of curvature of the third concave surface N3 whose concave surface faces the second object side (wafer W side) in the fifth lens group G5, being arranged on the second object side of the second concave surface N2; Rp1 is the radius of curvature of the positive lens whose surface faces the second object side (wafer W side) in the second lens group G2.

TABLE 1

Embodiment 1 d0 = 85.84542
β = -⅕
NA = 0.615
WD = 19.00000
φ EX = 15.6
L = 1200.0

| | r | d | n | |
|---|---|---|---|---|
| 1 | +688.21752 | 28.00000 | 1.615481 | |
| 2 | -304.80855 | 3.00000 | 1.000000 | |
| 3 | -260.00000 | 16.00000 | 1.612652 | |
| 4 | +368.80413 | 3.35615 | 1.000000 | |
| 5 | +461.11900 | 29.70000 | 1.488581 | |
| 6 | -307.69507 | 0.50000 | 1.000000 | |
| 7 | +239.65577 | 29.50000 | 1.615481 | |
| 8 | -1376.88881 | 0.50000 | 1.000000 | |
| 9 | +228.88522 | 27.50000 | 1.615481 | |
| 10 | ∞ | 1.00000 | 1.000000 | |
| 11 | ∞ | 16.78114 | 1.612652 | |
| 12 | +111.01247 | 15.18344 | 1.000000 | |
| 13 | +265.68330 | 25.31033 | 1.612652 | |
| 14 | -454.57241 | 0.50000 | 1000000 | (Rp1) |
| 15 | ∞ | 14.00000 | 1.615481 | |
| 16 | +118.40199 | 22.46541 | 1.000000 | |
| 17 | -226.66098 | 12.50000 | 1.488581 | |
| 18 | +194.30010 | 41.51491 | 1.000000 | |
| 19 | -156.23447 | 25.10411 | 1.615481 | |
| 20 | ∞ | 13.02696 | 1.000000 | |
| 21 | +34928.96053 | 32.95326 | 1.615481 | |

TABLE 1-continued

Embodiment 1 d0 = 85.84542
β = -⅕
NA = 0.615
WD = 19.00000
φ EX = 15.6
L = 1200.0

| | r | d | n | |
|---|---|---|---|---|
| 22 | -178.06192 | 10.06888 | 1.000000 | |
| 23. | -131.67222 | 37.89036 | 1.615481 | |
| 24 | -191.14704 | 0.33328 | 1.000000 | |
| 25 | -469.70082 | 24.50000 | 1.615481 | |
| 26 | -283.99212 | 0.50000 | 1.000000 | |
| 27 | +600.00000 | 27.20000 | 1.615481 | |
| 28 | -765.79841 | 1.00000 | 1.000000 | |
| 29 | +355.41259 | 26.70000 | 1.615481 | |
| 30 | -3341.54309 | 0.50000 | 1.000000 | |
| 31 | +282.87225 | 27.76907 | 1.615481 | |
| 32 | +446.45715 | 0.50000 | 1.000000 | |
| 33 | +202.70054 | 32.51731 | 1.615481 | |
| 34 | +200.68509 | 8.59820 | 1.000000 | |
| 35 | +343.842.96 | 16.00000 | 1.612652 | |
| 36 | +122.88028 | 32.68047 | 1.000000 | |
| 37 | -238.49136 | 12.00000 | 1.615481 | |
| 38 | +327.42830 | 28.94742 | 1.000000 | |
| 39 | -128.99436 | 25.18701 | 1.612652 | |
| 40 | -4297.59062 | 0.74569 | 1.000000 | |
| 41 | -3796.93992 | 35.83378 | 1.488581 | |
| 42 | -182.01599 | 7.50000 | 1.000000 | |
| 43 | ∞ | 10.00000 | 1.000000 | (AS) |
| 44 | -1584.12678 | 24.00000 | 1.488581 | |
| 45 | -259.53358 | 0.52257 | 1.000000 | |
| 46 | +496.66960 | 41.53348 | 1.615481 | |
| 47 | -312.30796 | 5.38895 | 1.000000 | |
| 48 | -259.40216 | 22.50000 | 1.612652 | (Rn1) |
| 49 | -546.90264 | 0.50000 | 1.000000 | |
| 50 | +419.50404 | 22.80000 | 1.612652 | |
| 51 | +260.51140 | 4.26113 | 1.000000 | (Rn2) |
| 52 | +290.00312 | 37.01218 | 1.488581 | |
| 53 | -1172.29742 | 0.50000 | 1.000000 | |
| 54 | +224.50188 | 28.30000 | 1.488581 | |
| 55 | +772.01014 | 0.50000 | 1.000000 | |
| 56 | +160.97601 | 28.20000 | 1.488581 | |
| 57 | +316.67288 | 0.50000 | 1.000000 | |
| 58 | +142.78331 | 42.24908 | 1.488581 | |
| 59 | +1374.88582 | 0.80000 | 1.000000 | |
| 60 | +1400.00000 | 21.59241 | 1.612652 | |
| 61 | +80.50236 | 23.59041 | 1.000000 | (Rn3) |
| 62 | +86.82687 | 65.03716 | 1.612652 | |
| 63 | +723.24389 | (WD) | 1.000000 | (R5g) |

TABLE 2

Conditions Corresponding to Values of Embodiment 1

(1) f1/L = 0.151
(2) -f2/L = 0.049
(3) f3/L = 0.181
(4) -f4/L = 0.058
(5) f5p/L = 0.125
(6) f5g/L = 0.129
(7) R5g/L = 0.603
(8) -Rn1/L = 0.216
(9) (r1 + r2)/(r1 - r2) = -0.603 (L55)
    (r1 + r2)/(r1 - r2) = -1.820 (L56)
    (r1 + r2)/(r1 - r2) = -3.067 (L57)
    (r1 + r2)/(r1 - r2) = -1.232 (L58)
    (r1 + r2)/(r1 - r2) = -1.273 (G-5g)
(10) Rn2/L = 0.217
(11) Rn3/L = 0.067
(12) -Rp1/L = 0.379

TABLE 3

Embodiment 2

| | | |
|---|---|---|
| d0 | = | 80.999999 |
| β | = | −1/5 |
| NA | = | 0.615 |
| WD | = | 18.500000 |
| φEX | = | 15.6 |
| L | = | 1206.0 |

| | r | d | n | |
|---|---|---|---|---|
| 1 | +750.16279 | 31.500000 | 1.615481 | |
| 2 | −220.00000 | 1.000000 | 1.000000 | |
| 3 | −218.06788 | 15.000000 | 1.612652 | |
| 4 | +325.97570 | 5.500000 | 1.000000 | |
| 5 | +491.19195 | 29.000000 | 1.488581 | |
| 6 | −347.17405 | 0.500000 | 1.000000 | |
| 7 | +209.56408 | 29.000000 | 1.615481 | |
| 8 | −2963.85079 | 0.100000 | 1.000000 | |
| 9 | +240.78134 | 32.643740 | 1.612652 | |
| 10 | +117.46219 | 14.500000 | 1.000000 | |
| 11 | +244.32765 | 34.452790 | 1.615481 | |
| 12 | −460.28921 | 0.500000 | 1.000000 | (Rp1) |
| 13 | ∞ | 14.000000 | 1.488581 | |
| 14 | +111.22015 | 22.500000 | 1.000000 | |
| 15 | −345.82103 | 11.000000 | 1.488581 | |
| 16 | +166.18604 | 40.292246 | 1.000000 | |
| 17 | −139.60880 | 19.485492 | 1.615481 | |
| 18 | ∞ | 11.087291 | 1.000000 | |
| 19 | −687.60891 | 50.004491 | 1.615481 | |
| 20 | −179.90164 | 13.955924 | 1.000000 | |
| 21 | −133.90676 | 30.456495 | 1.615481 | |
| 22 | −169.00248 | 0.211350 | 1.000000 | |
| 23 | −768.89404 | 24.230173 | 1.615481 | |
| 24 | −367.90453 | 0.697066 | 1.000000 | |
| 25 | +589.13165 | 28.000000 | 1.615481 | |
| 26 | −665.24739 | 1.000000 | 1.000000 | |
| 27 | +294.16305 | 27.500000 | 1.615481 | |
| 28 | −8769.55173 | 5.000000 | 1.000000 | |
| 29 | +253.91512 | 62.624436 | 1.615481 | |
| 30 | +263.05747 | 5.500000 | 1.000000 | |
| 31 | +376.43451 | 16.000000 | 1.612652 | |
| 32 | +127.23648 | 31.365482 | 1.000000 | |
| 33 | −239.44157 | 18.177545 | 1.615481 | |
| 34 | +377.83226 | 25.803559 | 1.000000 | |
| 35 | −128.22564 | 24.700973 | 1.612652 | |
| 36 | −4833.52939 | 1.375434 | 1.000000 | |
| 37 | −4745.08654 | 38.000000 | 1.488581 | |
| 38 | −185.32072 | 4.501154 | 1.000000 | |
| 39 | ∞ | 10.000000 | 1.000000 | (AS) |
| 40 | −1309.89752 | 22.500000 | 1.488581 | |
| 41 | −258.91713 | 0.500000 | 1.000000 | |
| 42 | +494.92084 | 36.200000 | 1.615481 | |
| 43 | −358.82852 | 7.000000 | 1.000000 | |
| 44 | −257.60152 | 22.500000 | 1.612652 | (Rn1) |
| 45 | −419.07467 | 0.500000 | 1.000000 | |
| 46 | +505.02516 | 22.500000 | 1.612652 | |
| 47 | +272.40529 | 4.500000 | 1.000000 | (Rn2) |
| 48 | +317.61979 | 35.000000 | 1.488581 | |
| 49 | −792.89840 | 0.500000 | 1.000000 | |
| 50 | +218.71786 | 28.962888 | 1.488581 | |
| 51 | +662.60545 | 0.500000 | 1.00000 | |
| 52 | +161.06828 | 28.860652 | 1.488581 | |
| 53 | +349.22176 | 0.500000 | 1.000000 | |
| 54 | +140.52530 | 40.500000 | 1.488581 | |
| 55 | +1115.07674 | 1.200000 | 1.000000 | |
| 56 | +1121.39823 | 27.157998 | 1.612652 | |
| 57 | +78.14303 | 25.119961 | 1.000000 | (Rn3) |
| 58 | +83.95729 | 61.871165 | 1.615481 | |
| 59 | +610.60171 | (WD) | 1.000000 | (R5g) |

TABLE 4

Conditions Corresponding to Values of Embodiment 2

(1) f1/L = 0.153
(2) −f2/L = 0.052

TABLE 4-continued

Conditions Corresponding to Values of Embodiment 2

(3) f3/L = 0.167
(4) −f4/L = 0.059
(5) f5p/L = 0.123
(6) f5g/L = 0.126
(7) R5g/L = 0.506
(8) −Rn1/L = 0.214
(9) (r1 + r2)/(r1 − r2) = −0.428 (L55)
  (r1 + r2)/(r1 − r2) = −1.985 (L56)
  (r1 + r2)/(r1 − r2) = −2.712 (L57)
  (r1 + r2)/(r1 − r2) = −1.288 (L58)
  (r1 + r2)/(r1 − r2) = −1.319 (G-5g)
(10) Rn2/L = 0.226
(11) Rn3/L = 0.065
(12) −Rp1/L = 0.382

TABLE 5

Embodiment 3

| | | |
|---|---|---|
| d0 | = | 89.000005 |
| β | = | −1/5 |
| NA | = | 0.615 |
| WD | = | 24.111595 |
| φEX | = | 15.6 |
| L | = | 1196.9 |

| | r | d | n | |
|---|---|---|---|---|
| 1 | +1939.55307 | 20.000000 | 1.612652 | |
| 2 | +281.11390 | 10.000000 | 1.000000 | |
| 3 | +449.55943 | 35.270328 | 1.488581 | |
| 4 | −297.94970 | 0.750000 | 1.000000 | |
| 5 | +218.50353 | 33.087008 | 1.615481 | |
| 6 | −14376.50699 | 0.750000 | 1.000000 | |
| 7 | +244.41294 | 29.787159 | 1.615481 | |
| 8 | −1864.37795 | 2.687228 | 1.000000 | |
| 9 | ∞ | 18.000000 | 1.612652 | |
| 10 | +118.07733 | 18.830325 | 1.000000 | |
| 11 | +279.60240 | 27.626374 | 1.488581 | |
| 12 | −286.15373 | 0.750000 | 1.000000 | (Rp1) |
| 13 | ∞ | 15.000000 | 1.615481 | |
| 14 | +121.77422 | 29.691393 | 1.000000 | |
| 15 | −167.29133 | 15.000000 | 1.488581 | |
| 16 | +221.37517 | 28.176548 | 1.000000 | |
| 17 | −138.14211 | 22.698390 | 1.615481 | |
| 18 | −694.99352 | 17.324597 | 1.000000 | |
| 19 | −185.35363 | 22.000000 | 1.615481 | |
| 20 | −163.34223 | 0.750000 | 1.000000 | |
| 21 | −345.59298 | 23.000000 | 1.615481 | |
| 22 | −212.88125 | 0.750000 | 1.000000 | |
| 23 | +837.47091 | 26.807371 | 1.615481 | |
| 24 | −592.54078 | 0.750000 | 1.000000 | |
| 25 | +459.67736 | 31.017354 | 1.615481 | |
| 26 | −907.11817 | 0.750000 | 1.000000 | |
| 27 | +350.77664 | 29.961953 | 1.615481 | |
| 28 | −2426.68761 | 34.608122 | 1.000000 | |
| 29 | +306.42564 | 31.336383 | 1.615481 | |
| 30 | +852.58779 | 9.336240 | 1.000000 | |
| 31 | +1574.58744 | 15.000000 | 1.612652 | |
| 32 | +153.47868 | 32.327949 | 1.000000 | |
| 33 | −218.70659 | 15.000000 | 1.474577 | |
| 34 | +223.84681 | 32.858042 | 1.000000 | |
| 35 | −130.06518 | 34.891416 | 1.612652 | |
| 36 | ∞ | 11.977743 | 1.000000 | |
| 37 | −875.00063 | 29.234902 | 1.488581 | |
| 38 | −197.32427 | 5.753854 | 1.000000 | |
| 39 | ∞ | 5.750000 | 1.000000 | (AS) |
| 40 | +10711.4496 | 24.726209 | 1.488581 | |
| 41 | −362.20077 | 0.750000 | 1.000000 | |
| 42 | +1119.16124 | 29.083421 | 1.615481 | |
| 43 | −446.03300 | 0.750000 | 1.000000 | |
| 44 | +406.10622 | 36.912931 | 1.615481 | |
| 45 | −582.51787 | 10.094086 | 1.000000 | |
| 46 | −343.68000 | 25.000000 | 1.612652 | (Rn1) |
| 47 | +405.99622 | 3.000000 | 1.000000 | (Rn2) |

TABLE 5-continued

Embodiment 3

| | | |
|---|---|---|
| d0 | = | 89.000005 |
| β | = | -1/5 |
| NA | = | 0.615 |
| WD | = | 24.111595 |
| φEX | = | 15.6 |
| L | = | 1196.9 |

| | r | d | n | |
|---|---|---|---|---|
| 48 | +419.51179 | 30.258707 | 1.488581 | |
| 49 | −821.25172 | 0.750000 | 1.000000 | |
| 50 | +290.40653 | 31.872997 | 1.488581 | |
| 51 | +5465.29011 | 0.750000 | 1.000000 | |
| 52 | +193.15728 | 31.609321 | 1.488581 | |
| 53 | +704.11950 | 0.750000 | 1.000000 | |
| 54 | +123.03501 | 37.520745 | 1.488581 | |
| 55 | +456.16128 | 6.394985 | 1.000000 | |
| 56 | +615.85448 | 24.530116 | 1.612652 | |
| 57 | +75.77168 | 19.182042 | 1.000000 | (Rn3) |
| 58 | +81.95198 | 50.514912 | 1.615481 | |
| 59 | +798.82187 | (WD) | 1.000000 | (R5g) |

TABLE 6

Conditions Corresponding to Values of Embodiment 3

(1) f1/L = 0.153
(2) −f2/L = 0.051
(3) f3/L = 0.157
(4) −f4/L = 0.054
(5) f5p/L = 0.151
(6) f5g/L = 0.121
(7) R5g/L = 0.667
(8) −Rn1/L = 0.287
(9) (r1 + r2)/(r1 − r2) = −0.323 (L55)
    (r1 + r2)/(r1 − r2) = −1.112 (L56)
    (r1 + r2)/(r1 − r2) = −1.756 (L57)
    (r1 + r2)/(r1 − r2) = −1.739 (L58)
    (r1 + r2)/(r1 − r2) = −1.228 (G-5g)
(10) Rn2/L = 0.339
(11) Rn3/L = 0.063
(12) −Rp1/L = 0.239

TABLE 7

Embodiment 4

| | | |
|---|---|---|
| d0 | = | 81.01932 |
| β | = | -1/5 |
| NA | = | 0.63 |
| WD | = | 19.94252 |
| φEX | = | 15.6 |
| L | = | 1200 |

| | r | d | n | |
|---|---|---|---|---|
| 1 | +572.19707 | 26.40000 | 1.488581 | |
| 2 | −517.13581 | 1.00000 | 1.000000 | |
| 3 | −576.11938 | 16.00000 | 1.612652 | |
| 4 | +319.72892 | 4.82984 | 1.000000 | |
| 5 | +427.45496 | 30.50000 | 1.488581 | |
| 6 | −348.64320 | 0.50000 | 1.000000 | |
| 7 | +211.54187 | 29.80000 | 1.615481 | |
| 8 | −1941.96326 | 0.50000 | 1.000000 | |
| 9 | +232.39566 | 27.50000 | 1.615481 | |
| 10 | ∞ | 1.00000 | 1.000000 | |
| 11 | ∞ | 19.61130 | 1.612652 | |
| 12 | +108.28670 | 16.93605 | 1.000000 | |
| 13 | +310.86505 | 24.84600 | 1.612652 | |
| 14 | −413.92152 | 0.50000 | 1.000000 | (Rp1) |
| 15 | ∞ | 14.00000 | 1.612652 | |
| 16 | +115.98913 | 22.76912 | 1.000000 | |
| 17 | −242.83640 | 12.50000 | 1.612652 | |
| 18 | +203.84520 | 42.27431 | 1.000000 | |

TABLE 7-continued

Embodiment 4

| | | |
|---|---|---|
| d0 | = | 81.01932 |
| β | = | -1/5 |
| NA | = | 0.63 |
| WD | = | 19.94252 |
| φEX | = | 15.6 |
| L | = | 1200 |

| | r | d | n | |
|---|---|---|---|---|
| 19 | −158.64281 | 13.26131 | 1.488581 | |
| 20 | ∞ | 13.26131 | 1.000000 | |
| 21 | +5263.42400 | 33.62118 | 1.615481 | |
| 22 | −182.40419 | 13.08969 | 1.000000 | |
| 23 | −132.22030 | 37.99541 | 1.615481 | |
| 24 | −198.71889 | 3.01709 | 1.000000 | |
| 25 | −504.28103 | 24.50000 | 1.615481 | |
| 26 | −271.06241 | 0.50000 | 1.000000 | |
| 27 | +600.00000 | 27.20000 | 1.615481 | |
| 28 | −728.23893 | 0.50000 | 1.000000 | |
| 29 | +419.04064 | 26.70000 | 1.615481 | |
| 30 | −1643.86644 | 0.50000 | 1.000000 | |
| 31 | +295.50686 | 28.41946 | 1.615481 | |
| 32 | +520.71040 | 0.50000 | 1.000000 | |
| 33 | +214.07728 | 32.77156 | 1.615481 | |
| 34 | +255.89539 | 9.25471 | 1.000000 | |
| 35. | +637.66197 | 16.00000 | 1.612652 | |
| 36 | +132.66792 | 30.54047 | 1.000000 | |
| 37 | −261.10317 | 12.00000 | 1.615481 | |
| 38 | +278.54372 | 30.19397 | 1.000000 | |
| 39 | −129.90564 | 25.13618 | 1.612652 | |
| 40 | −6068.89035 | 0.78038 | 1.000000 | |
| 41 | −4001.34463 | 35.75687 | 1.488581 | |
| 42 | −182.47255 | 11.61871 | 1.000000 | |
| 43 | ∞ | 5.00000 | 1.000000 | (AS) |
| 44 | −1901.93658 | 24.00000 | 1.488581 | |
| 45 | −268.92809 | 0.52257 | 1.000000 | |
| 46 | +471.20841 | 40.17914 | 1.615481 | |
| 47 | −328.64737 | 5.49342 | 1.000000 | |
| 48 | −264.96403 | 22.50000 | 1.612652 | (Rn1) |
| 49 | −559.53762 | 0.50000 | 1.000000 | |
| 50 | +431.81643 | 22.80000 | 1.612652 | |
| 51 | +272.80518 | 4.29657 | 1.000000 | (Rn2) |
| 52 | +318.81215 | 35.65154 | 1.488581 | |
| 53 | −904.77148 | 0.50000 | 1.000000 | |
| 54 | +231.59428 | 28.30000 | 1.488581 | |
| 55 | +851.03579 | 0.50000 | 1.000000 | |
| 56 | +163.97092 | 28.20000 | 1.488581 | |
| 57 | +322.06954 | 0.50000 | 1.000000 | |
| 58 | +140.43124 | 42.06842 | 1.488581 | |
| 59 | +1885.70600 | 0.80000 | 1.000000 | |
| 60 | +1890.45700 | 21.50825 | 1.612652 | |
| 61 | +83.55412 | 23.58350 | 1.000000 | (Rn3) |
| 62 | +91.71370 | 62.13512 | 1.615481 | |
| 63 | +748.85306 | (WD) | 1.000000 | (R5g) |

TABLE 8

Conditions Corresponding to Values of Embodiment 4

(1) f1/L = 0.148
(2) −f2/L = 0.050
(3) f3/L = 0.176
(4) −f4/L = 0.055
(5) f5p/L = 0.125
(6) f5g/L = 0.136
(7) R5g/L = 0.624
(8) −Rn1/L = 0.221
(9) (r1 + r2)/(r1 − r2) = 0.479 (L55)
    (r1 + r2)/(r1 − r2) = 1.748 (L56)
    (r1 + r2)/(r1 − r2) = 3.074 (L57)
    (r1 + r2)/(r1 − r2) = 1.168 (L58)
    (r1 + r2)/(r1 − r2) = 1.279 (G5g)

TABLE 8-continued

Conditions Corresponding to Values of Embodiment 4

(10) Rn2/L = 0.227
(11) Rn3/L = 0.069
(12) −Rp1/L = 0.345

As is clear from the various values of each embodiment shown above, the projection optical system of Embodiments 1 through 4 provides a large numerical aperture while maintaining a wide exposure range.

FIGS. 4, 7, 10 and 13 are diagrams showing longitudinal aberrations of the projection optical system of Embodiments 1 through 4, respectively. FIGS. 5, 8, 11 and 14 are diagrams showing transverse (lateral) aberrations in the tangential and sagittal directions. In each of the aberration diagrams, NA denotes the numerical aperture of a projection optical system, and Y denotes the image height. In astigmatism diagrams, dotted lines denote the tangential image plane and a solid line denotes a sagittal image plane.

Comparing each of the aberration diagrams, it is clear that various aberrations are corrected uniformly in each of the embodiments, more specifically, various aberrations in all wide exposure regions are excellently corrected.

Note that I-line of ultraviolet radiation were used as the light source in each of the embodiments above. However, this does not limit the application of the apparatus incorporating the principles of the present invention. An extreme ultraviolet light source such as a 193 nm or 248.8 nm excimer laser and the like, a mercury arc lamp which supplies a g-line (435.8 nm) or h-line (404.7 nm) laser, or another light source which supplies radiation in the ultraviolet region may be used.

As described above, a high performance projection optical system incorporating the principles of the present invention excellently corrects various aberrations, especially distortions, while maintaining a large numerical aperture number and a wide exposure region with bitelecentricity.

If the projection optical system incorporating the principles of the present invention is applied to a projection exposure apparatus, an extremely precise circuitry pattern can be formed on wide exposure regions on a wafer.

Various modifications will become possible for those skilled in the art after receiving the teachings of the present disclosure without departing from the scope thereof.

What is claimed is:

1. A projection optical system in which an image of a first object is printed onto a second object, said system comprising in order from said first object side:
a first lens group having a positive refractive power with at least three positive lenses;
a second lens group having a negative refractive power with at least three negative lenses and one positive lens;
a third lens group having a positive refractive power with at least three positive lenses and one negative lens;
a fourth lens group having a negative refractive power with at least three negative lenses; and
a fifth lens group having a positive refractive power with at least six positive lenses and one negative lens wherein:
said first lens group has a subgroup G-1$p$ having at least two positive lenses;
said second lens group has a subgroup G-2$n$ having at least three negative lenses;
said third lens group has a subgroup G-3$p$ having at least three positive lenses;
said fourth lens group has a subgroup G-4$n$ having at least three negative lenses; and
said fifth lens group has a subgroup G-5$p$ having at least five positive lenses and a positive lens G-5$g$ having a concave surface facing said second object side and being closer to the second object side than said subgroup G-5$p$, said system satisfying the following equations (1) through (7):

$$0.08 < f1/L < 0.25 \quad (1)$$

$$0.03 < -f2/L < 0.1 \quad (2)$$

$$0.08 < f3/L < 0.3 \quad (3)$$

$$0.035 < -f4/L < 0.11 \quad (4)$$

$$0.1 < f5p/L < 0.25 \quad (5)$$

$$0.07 < f5g/L < 0.21 \quad (6)$$

$$0.25 < R5g/L < 0.83 \quad (7)$$

where:
L is the distance from said first object to the second object;
f1 is the focal length of said subgroup G-1$p$ of said first lens group;
f2 is the focal length of said subgroup G-2$n$ of said second lens group;
f3 is the focal length of said subgroup G-3$p$ of said third lens group;
f4 is the focal length of said subgroup G-4$n$ of said fourth lens group;
f5$p$ is the focal length of said subgroup G-5$p$ of said fifth lens group;
f5$g$ is the focal length of said subgroup G-5$g$ of said fifth lens group; and
R5$g$ is the radius of curvature of the concave surface of said positive lens G-5$g$ facing the second object side.

2. A projection optical system, as claimed in claim 1, wherein said fifth lens group has a first concave surface N1 facing said first object side and satisfies the following equation (8) where the radius of curvature of said concave surface N1 is Rn1:

$$0.125 < -Rn1/L < 0.33 \quad (8).$$

3. A projection optical system, as claimed in claim 1, wherein said fifth lens group has at least four positive lenses which satisfy the following equation (9):

$$-10 < (r1+r2)/(r1-r2) < -0.1 \quad (9)$$

where:
r1 is the radius of curvature of at least four positive lens of the first object side; and
r2 is a radius of curvature of at least four positive lens of the second object side.

4. A projection optical system, as claimed in claim 2, wherein said fifth lens group has at least four positive lenses which satisfy the following equation (9):

$$-10 < (r1+r2)/(r1-r2) < -0.1 \quad (9)$$

where:

r1 is the radius of curvature of at least four positive lens of the first object side; and r2 is a radius of curvature of at least four positive lens of the second object side.

5. A projection optical system, as claimed in claim 2, wherein said fifth lens group comprises:

a second concave surface N2 whose concave surface faces said second object side; and a third concave surface N3 whose concave surface faces said second object side and being closer to said second object side than said second concave surface N2; and satisfies the following equations (10) and (11):

$$0.16 < Rn2/L < 0.38 \quad (10)$$

$$0.055 < Rn3/L < 0.11 \quad (11)$$

where:

Rn2 is the radius of curvature of said second concave surface N2; and

Rn3 is the radius of curvature of said third concave surface N3.

6. A projection optical system, as claimed in claim 3, wherein said fifth lens group comprises:

a second concave surface N2 whose concave surface faces said second object side; and a third concave surface N3 whose concave surface faces said second object side and being closer to said second object side than said second concave surface N2; and satisfies the following equations (10) and (11):

$$0.16 < Rn2/L < 0.38 \quad (10)$$

$$0.055 < Rn3/L < 0.11 \quad (11)$$

where:

Rn2 is the radius of curvature of said second concave surface N2; and

Rn3 is the radius of curvature of said third concave surface N3.

7. A projection optical system, as claimed in claim 1, wherein said second lens group comprises at least one positive lens and satisfies the following equation (12) when a radius of curvature of the surface facing said second object side of said positive lens of said second lens group is Rp1:

$$0.23 < -Rp1/L < 0.5 \quad (12).$$

8. A projection optical system, as claimed in claim 2, wherein said second lens group comprises at least one positive lens and satisfies the following equation (12) when a radius of curvature of the surface facing said second object side of said positive lens of said second lens group is Rp1:

$$0.23 < -Rp1/L < 0.5 \quad (12).$$

9. A projection optical system, as claimed in claim 3, wherein said second lens group comprises at least one positive lens and satisfies the following equation (12) when a radius of curvature of the surface facing said second object side of said positive lens of said second lens group is Rp1:

$$0.23 < -Rp1/L < 0.5 \quad (12).$$

10. A projection optical system, as claimed in claim 4, wherein said second lens group comprises at least one positive lens and satisfies the following equation (12) when a radius of curvature of the surface facing said second object side of said positive lens of said second lens group is Rp1:

$$0.23 < -Rp1/L < 0.5 \quad (12).$$

11. A projection optical system, as claimed in claim 1, wherein said positive lens of said second lens group is arranged closer to said first object side than said subgroup G-2n of said second lens group.

12. A projection optical system, as claimed in claim 2, wherein said positive lens of said second lens group is arranged closer to said first object side than said subgroup G-2n of said second lens group.

13. A projection optical system, as claimed in claim 1, wherein said negative lens of said third lens group is arranged closer to said first object side than said subgroup G-3p of said third lens group.

14. A projection optical system, as claimed in claim 2, wherein said negative lens of said third lens group is arranged closer to said first object side than said subgroup G-3p of said third lens group.

15. A projection optical system, as claimed in claim 1, wherein a first convex lens whose convex surface faces said first object side is arranged at a point closest to said first object side of said fourth lens group and a second convex lens whose convex surface faces said second object side is arranged closest to said second object side of said fourth lens group.

16. A projection optical system, as claimed in claim 2, wherein a first convex lens whose convex surface faces said first object side is arranged at a point closest to said first object side of said fourth lens group and a second convex lens whose convex surface faces said second object side is arranged closest to said second object side of said fourth lens group.

17. A projection optical system, as claimed in claim 3, wherein a first convex lens whose convex surface faces said first object side is arranged at a point closest to said first object side of said fourth lens group and a second convex lens whose convex surface faces said second object side is arranged closest to said second object side of said fourth lens group.

18. A projection optical system, as claimed in claim 4, wherein a first convex lens whose convex surface faces said first object side is arranged at a point closest to said first object side of said fourth lens group and a second convex lens whose convex surface faces said second object side is arranged closest to said second object side of said fourth lens group.

19. A projection optical system, as claimed in claim 1, wherein a positive lens is arranged at the first object side of said second lens group and said subgroup G-2n is arranged at the second object side of said second lens group.

20. A projection optical system, as claimed in claim 2, wherein a positive lens is arranged at the first object side of said second lens group and said subgroup G-2n is arranged at the second object side of said second lens group.

21. A projection optical system, as claimed in claim 4 wherein said first and second concave surfaces N1 and N2 in said fifth lens group are arranged in said subgroup G-5p in said fifth lens group.

22. A projection optical system, as claimed in claim 1, wherein said subgroup G-1p in said first lens group is comprised of positive lenses only.

23. A projection optical system, as claimed in claim 1 wherein said subgroup G-2n of said second lens group is comprised of negative lenses only.

24. A projection optical system, as claimed in claim 1, wherein said subgroup G-3p of said third lens group is comprised of positive lenses only.

25. A projection optical system, as claimed in claim 1, wherein said subgroup G-4n of said fourth lens group is comprised of negative lenses only.

26. A projection optical system, as claimed in claim 1, wherein said positive lens G-5g of said fifth lens group is a lens component which is arranged closest to said second object side.

27. A projection optical system, as claimed in claim 1, wherein said system further comprises:
   an illumination optical system which illuminates said first object;
   a first support member which supports said first object; and
   a second support member which supports said second object.

28. A method of manufacturing a device using a projection optical system, as claimed in claim 1, comprising the steps of:
   illuminating a mask with exposure light in the ultraviolet range, said mask having a predetermined circuit pattern drawn thereon; and
   forming an image of said pattern of said illuminated mask onto a substrate by means of said projection optical system.

29. An exposure apparatus having the projection optical system of claim 1, comprising:
   an illuminating system for supplying exposure radiation in the ultraviolet range;
   a first stage for holding said first object; and
   a second stage for holding said second object.

* * * * *